US010063246B2

(12) United States Patent
Grouwstra et al.

(10) Patent No.: US 10,063,246 B2
(45) Date of Patent: Aug. 28, 2018

(54) LOW-POWER FRACTIONAL-N PLLS

(71) Applicant: Perceptia Devices, Inc., Scotts Valley, CA (US)

(72) Inventors: André Grouwstra, Morgan Hill, CA (US); Julian Jenkins, Kurraba Point (AU)

(73) Assignee: Perceptia Devices, Inc., Morgan Hill, CA (US)

( * ) Notice: Subject to any disclaimer, the term of this patent is extended or adjusted under 35 U.S.C. 154(b) by 0 days.

(21) Appl. No.: 15/612,908

(22) Filed: Jun. 2, 2017

(65) Prior Publication Data

US 2018/0138914 A1  May 17, 2018

Related U.S. Application Data

(60) Provisional application No. 62/422,736, filed on Nov. 16, 2016.

(51) Int. Cl.
*H03L 7/06* (2006.01)
*H03L 7/14* (2006.01)
*H03L 7/091* (2006.01)
*H03L 7/197* (2006.01)

(52) U.S. Cl.
CPC ............. *H03L 7/14* (2013.01); *H03L 7/091* (2013.01); *H03L 7/1976* (2013.01)

(58) Field of Classification Search
USPC .................. 327/147–149, 156–158
See application file for complete search history.

(56) References Cited

U.S. PATENT DOCUMENTS

| 7,038,509 | B1 * | 5/2006 | Zhang | H03L 7/093 327/157 |
| 7,065,172 | B2 * | 6/2006 | Xiu | H03L 7/0996 327/147 |
| 7,308,372 | B2 * | 12/2007 | Rifani | G01R 29/0273 327/149 |
| 7,496,168 | B2 * | 2/2009 | Leonowich | H03L 7/081 327/156 |
| 7,764,134 | B2 * | 7/2010 | Fu | H03K 23/667 327/117 |
| 8,362,815 | B2 * | 1/2013 | Pavlovic | H03L 7/081 327/156 |
| 8,810,290 | B1 * | 8/2014 | Cloutier | H03L 7/0994 327/147 |
| 8,816,735 | B1 * | 8/2014 | Chen | H03L 7/085 327/149 |
| 8,994,423 | B2 * | 3/2015 | Jenkins | H03L 7/087 327/149 |

(Continued)

*Primary Examiner* — Adam Houston
(74) *Attorney, Agent, or Firm* — Grouwstra IC & Software Patent; André Grouwstra

(57) ABSTRACT

A phase-locked loop (PLL) has an oscillator, a counter and a register to sample the oscillator phase as an integer number. A phase predictor uses a fractional-N frequency control word (FCW) to calculate a predicted phase as an integer number. The integer difference between the sampled phase and the predicted phase is used as loop filter input, to generate an oscillator control code that adjusts the oscillator frequency. The phase predictor may provide noise shaping, for example via a MASH modulator. The PLL may be implemented with dedicated or off-the-shelf circuitry, in an FPGA, or with a programmable processor. A tangible non-transitory memory may hold an associated software instructions for fractional-N phase locking.

18 Claims, 17 Drawing Sheets

(56) References Cited

U.S. PATENT DOCUMENTS

| | | | |
|---|---|---|---|
| 9,160,351 B2* | 10/2015 | Chen | H03L 7/091 |
| 9,455,667 B2* | 9/2016 | Vlachogiannakis | H03B 5/1265 |
| 9,838,026 B2* | 12/2017 | Van Brunt | H03L 7/1974 |
| 2002/0191727 A1* | 12/2002 | Staszewski | H03C 3/0966 375/376 |
| 2004/0232995 A1* | 11/2004 | Thomsen | H03L 1/022 331/2 |
| 2010/0117743 A1* | 5/2010 | Da Dalt | H03L 7/16 331/18 |
| 2010/0271088 A1* | 10/2010 | Namba | H03L 1/027 327/157 |
| 2011/0009083 A1* | 1/2011 | Namba | H03B 21/02 455/318 |
| 2011/0156782 A1* | 6/2011 | Huang | G06F 1/022 327/159 |
| 2011/0188551 A1* | 8/2011 | Shin | H03L 7/08 375/219 |
| 2011/0193601 A1* | 8/2011 | Albasini | H03L 7/0891 327/156 |
| 2013/0058437 A1* | 3/2013 | Oshima | H03M 1/0836 375/316 |
| 2013/0113536 A1* | 5/2013 | Sfikas | H03L 7/091 327/158 |
| 2013/0187688 A1* | 7/2013 | Wang | H03C 5/00 |
| 2014/0184289 A1* | 7/2014 | Gailus | H03C 3/0925 327/156 |
| 2014/0266341 A1* | 9/2014 | Jang | H03L 7/085 327/156 |
| 2014/0340131 A1* | 11/2014 | Rey | H03L 7/093 327/156 |
| 2015/0116018 A1* | 4/2015 | Chen | H03L 7/091 327/159 |
| 2015/0145567 A1* | 5/2015 | Perrott | H03L 7/093 327/156 |
| 2016/0087639 A1* | 3/2016 | Wicpalek | H03L 7/085 327/154 |

* cited by examiner

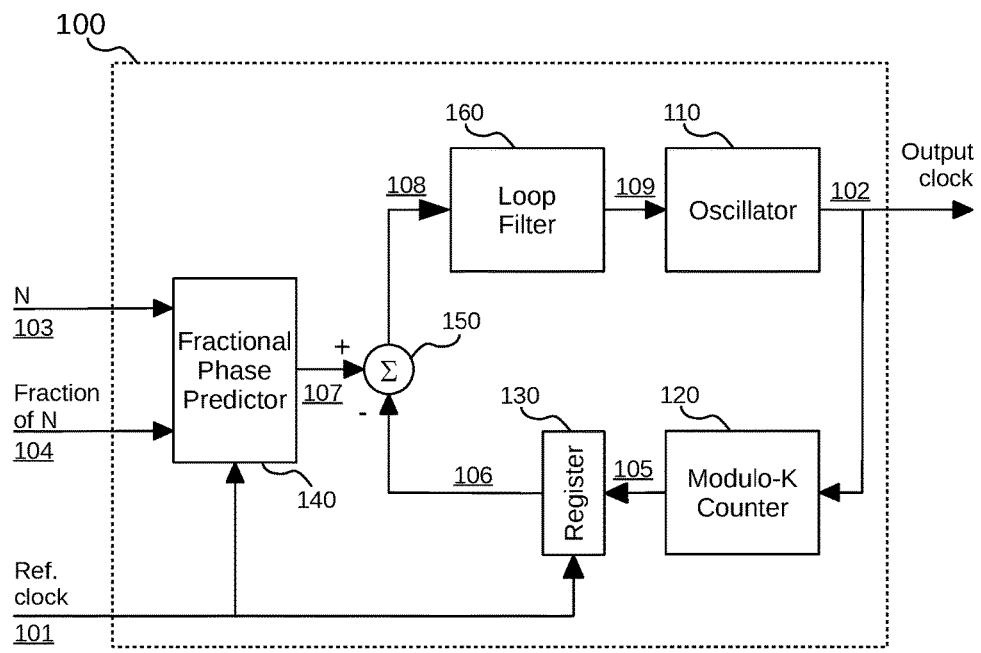
Fig. 1
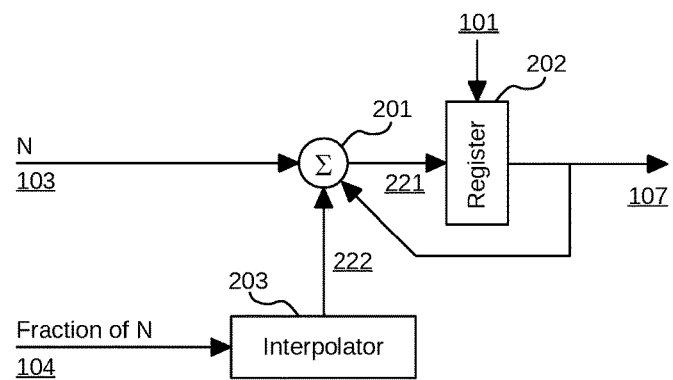
Fig. 2A – Fractional phase predictor

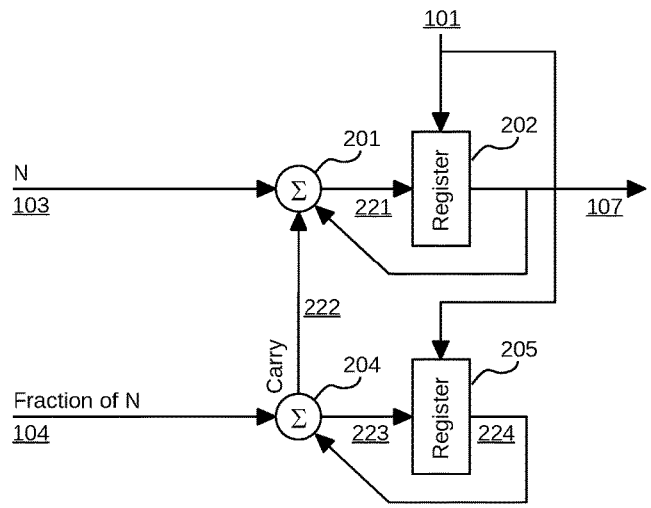
Fig. 2B – First order MASH
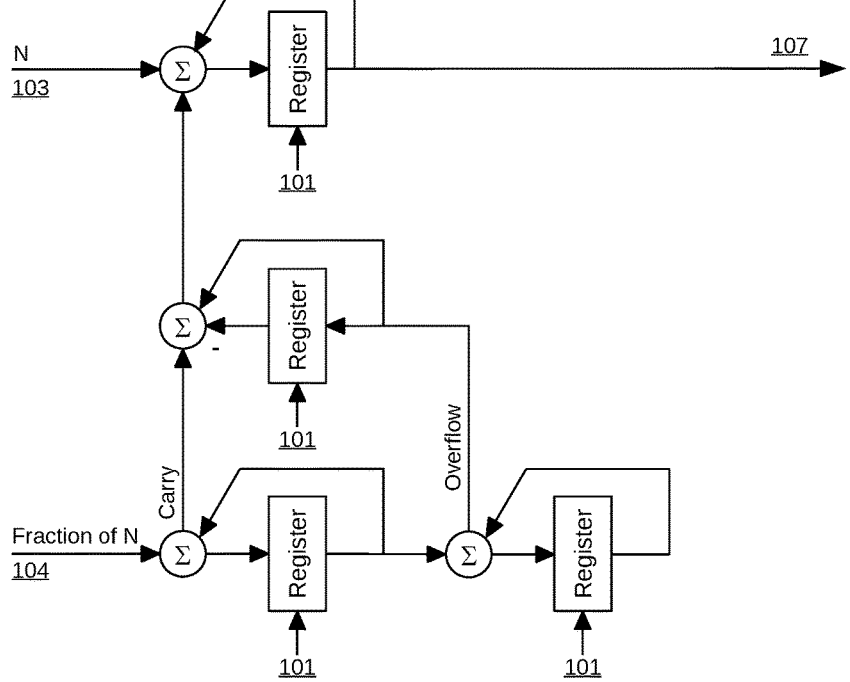
Fig. 2C – Second order MASH

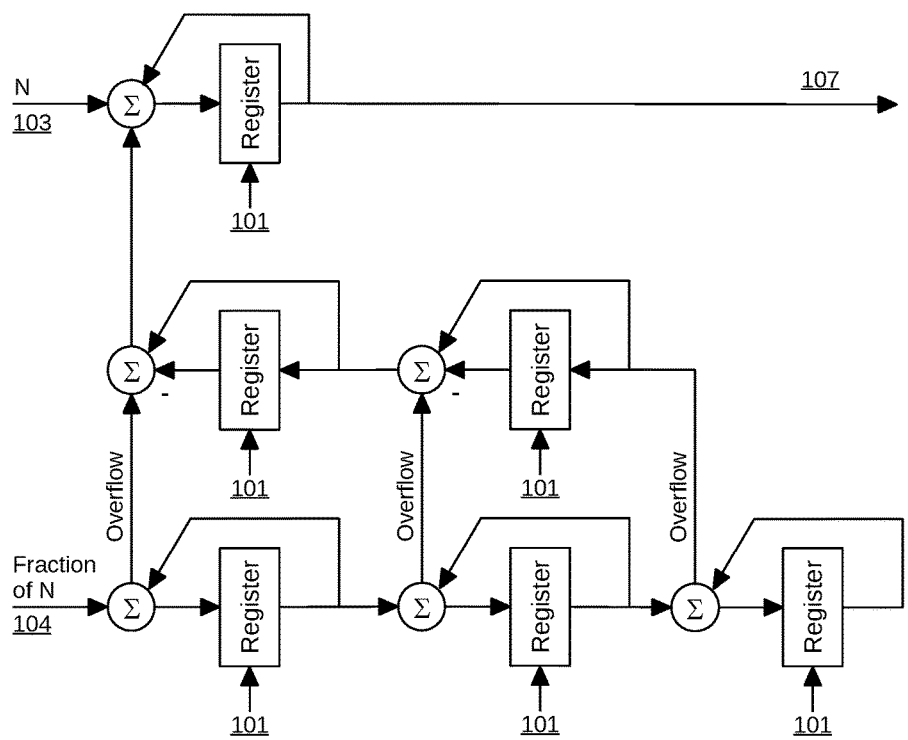
Fig. 2D – Third order MASH

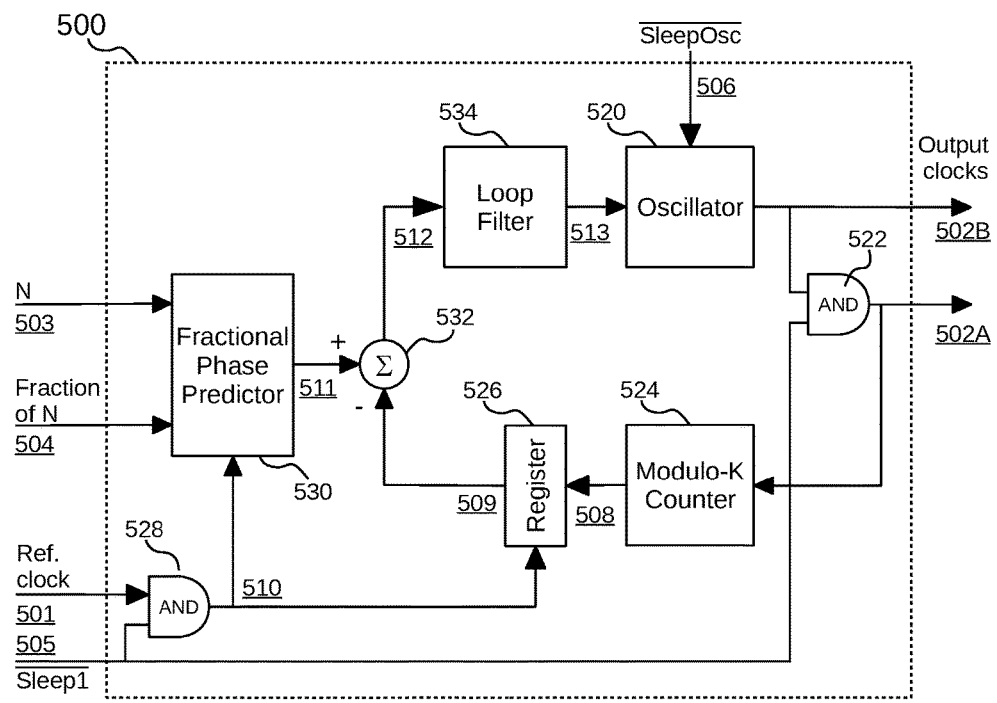
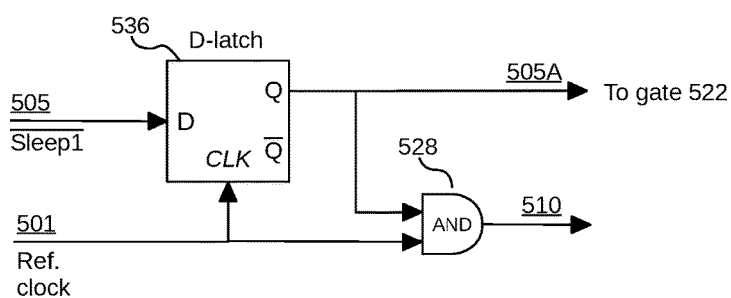
Fig. 5

LOW-POWER FRACTIONAL-N PLLS

CROSS REFERENCES TO RELATED APPLICATIONS

This application claims priority from U.S. provisional patent application Ser. No. 62/422,736, entitled "Low-Power Single-Loop and Multiple-Loop Fractional-N PLLs" filed on Nov. 16, 2016, which is hereby incorporated by reference as if set forth in full in this application for all purposes.

This application is related to U.S. patent application Ser. No. 15/612,982, entitled "Fractional-N Jitter Attenuator", filed on Jun. 2, 2017, which is hereby incorporated by reference as if set forth in full in this application for all purposes.

BACKGROUND

The present invention relates generally to electronic circuits used to generate clock signals and in particular to digital phase-locked loops (PLLs).

Phase-Locked Loops (PLLs) are circuits that produce an output clock signal whose phase is locked to the phase of an input reference clock signal. Phase, in the context of a PLL, means a signal's frequency value integrated over time, i.e., the signal's accumulated number of clock pulses. The ratio of the frequency of the output clock signal and the frequency of the reference clock signal can be a positive integer number, in which case the PLL is called an integer-N PLL; or it can be a positive rational number, in which case the PLL is called a fractional-N PLL. Rational numbers are numbers that can be expressed as a ratio of two integers. In the context of this document, a fractional-N number is a positive rational number consisting of an integer part (obtained by rounding down to the nearest integer number) and a fractional part.

A PLL includes a controlled oscillator that produces the output clock signal. An analog PLL usually has a voltage-controlled oscillator (VCO), and a digital PLL may have a digitally-controlled oscillator (DCO). A PLL locks the phase (and as a result, frequency) of the output clock signal to the reference clock signal by measuring the accumulated number of output clock cycles, and adjusting the controlled oscillator frequency when the measured number deviates from a required number, referred to as or obtained from a frequency control word (FCW). The ratio of output clock cycles to reference clock cycles, measured over some duration, is called the PLL's multiplication factor. When a PLL is in lock, its multiplication factor matches its FCW.

Frequency-Locked Loops (FLLs) are circuits that produce an output clock signal whose frequency is locked to the frequency of an input reference clock signal. Compared to a PLL, an FLL lacks the integration or accumulation over time. A PLL's integration may occur anywhere in its loop, for example in feedback circuits, or in feedforward circuits such as a loop filter. Whereas a PLL in lock will lock both frequency and phase ratios in output and reference signals, an FLL may lock only the frequency ratio but not necessarily the phase ratio.

In an integer-N PLL, the frequency resolution of the output clock signal equals the frequency of the reference clock signal, since the output clock frequency equals a positive integer number times the reference clock frequency. Increasing or decreasing the positive integer number by one will result in the output clock frequency increasing or decreasing by one times the reference frequency. A finer output frequency resolution can be achieved by using a lower reference clock frequency. However, in practical PLLs this may increase the jitter.

A fractional-N PLL can have a much better output clock frequency resolution without the need for a low reference clock frequency, as the ratio between the output clock and reference clock frequencies can be a positive rational number. An example of a fractional-N PLL is described in U.S. Pat. No. 8,994,523, entitled Phase-Locked Loop Apparatus and Method by Jenkins. The circuits described there provide potentially very high accuracy and low jitter, but at the expense of some energy. However, there is also a need for fractional-N PLLs that consume very little power, even if they operate with more jitter.

While most PLLs and FLLs have a single feedback loop, and are capable of locking to a single reference clock signal, some PLLs have multiple parallel feedback loops, allowing to lock to one of multiple reference clock signals, not necessarily of the same frequency. The capability to switch between the different reference clock signals without facing a discontinuity in phase and therefore a possibly extended lock-in time is called hitless switching. An example hitless switching PLL is described in U.S. Pat. No. 9,007,105 by Jenkins.

A jitter attenuator is a PLL with the capability to provide an output clock signal whose jitter is substantially lower than jitter in the reference clock signal. A jitter attenuator usually has multiple nested feedback loops. For example, it may have one or more primary feedback loops and one secondary feedback loop. The secondary loop may be locked to a highly stable reference source, such as a crystal oscillator, whereas the primary loop(s) may be locked to one or more unstable or jittery reference sources. The jitter attenuator's average output clock frequency may be locked to the frequency of one of the jittery reference sources, whereas its jitter may be determined by the stable reference source.

In many PLLs, whether used for logic clocking, video clocking, instrumentation, wireless, wired or optical communication, there is a need to lower power usage.

Reference to any prior art in the specification is not, and should not be taken as, an acknowledgment or any form of suggestion that this prior art forms part of the common general knowledge in the USA, China, Australia, or any other jurisdiction or that this prior art could reasonably be expected to be ascertained, understood and regarded as relevant by a person skilled in the art.

SUMMARY

In a first aspect, an embodiment of the invention comprises a controlled oscillator producing an output clock signal. A modulo-K counter measures the output clock phase, and a register, upon receiving a reference clock signal pulse, samples the output clock phase as an integer number of clock cycles. A fractional phase predictor calculates a predicted phase as an integer number of clock cycles, based on the phase of the reference clock signal (i.e., the number of reference clock signal pulses received) and on a rational number frequency control word (FCW). A subtractor or adder calculates the difference between the sampled output clock phase and the predicted phase. The embodiment uses the difference, filtered by a loop filter, to correct the controlled oscillator's frequency.

In embodiments, the modulo-K counter and the fractional phase predictor may have a range that is much larger than a maximum number of output clock cycles during a reference clock signal cycle. In further embodiments, the fractional phase predictor may include an interpolator for determining an integer number part of the predicted phase based on a fractional part of the FCW. The interpolator may provide a noise-shaping function, for example a sigma delta modulator or a multistage noise shaping (MASH) modulator.

In a second aspect, an embodiment of the invention provides a method for generating an output clock signal whose phase is locked to a reference clock signal phase by a rational number. The method comprises the following steps: in a controlled oscillator, generating an output clock signal, wherein an output clock frequency is controlled by an oscillator control code; in a modulo-K counter, counting a number of output clock cycles; upon receiving a reference clock signal pulse, sampling the counted number of output clock cycles and storing the sampled number of output clock cycles in a register; upon receiving the reference clock signal pulse, calculating an integer number of predicted output clock cycles based on an integer number representing a reference clock signal phase and a rational number representing a frequency control word (FCW); calculating a difference between the integer number of predicted output clock cycles and the sampled number of output clock cycles, and forwarding the difference to a digital loop filter; in the digital loop filter, filtering the calculated difference to generate an updated oscillator control code, and in the controlled oscillator, updating the output clock frequency; and upon receiving successive reference clock signal pulses, updating the sampled number of output clock cycles and the number of predicted output clock cycles to provide the controlled oscillator updated oscillator control codes to lock the output clock signal phase to the reference clock signal phase by a rational number.

In a third aspect, an embodiment of the invention provides a programmable PLL, with a programmable processor, a memory, a controlled oscillator, and a modulo-K counter. The programmable processor is programmed to execute the following operations: (a) upon receiving a reference clock signal pulse, sampling a modulo-K counter output value and storing the output value as a sampled phase in a register; (b) upon receiving the reference clock signal pulse, calculating an integer number of predicted output clock cycles based on an integer number representing a reference clock signal phase and a rational number representing a frequency control word (FCW); (c) calculating a difference between the integer number of predicted output clock cycles and the sampled phase; (d) loop filtering the calculated difference to generate an updated oscillator control code; and (e) upon receiving successive reference clock signal pulses, updating the sampled phase and the number of predicted output clock cycles to provide the controlled oscillator updated oscillator control codes to lock the output clock signal phase to the reference clock signal phase.

In a fourth aspect, an embodiment of the invention provides a tangible non-transitory memory with software instructions for the following operations: (a) upon receiving a reference clock signal pulse, sampling a modulo-K counter output value and storing the output value as a sampled phase in a register; (b) upon receiving the reference clock signal pulse, calculating an integer number of predicted output clock cycles based on an integer number representing a reference clock signal phase and a rational number representing a frequency control word (FCW); (c) calculating a difference between the integer number of predicted output clock cycles and the sampled phase; (d) loop filtering the calculated difference to generate an updated oscillator control code; and (e) upon receiving successive reference clock signal pulses, updating the sampled phase and the number of predicted output clock cycles to provide a controlled oscillator updated oscillator control codes to lock an output clock signal phase to the reference clock signal phase.

As used herein, except where the context requires otherwise, the term "comprise" and variations of the term, such as "comprising", "comprises" and "comprised", are not intended to exclude further additives, components, integers or steps.

Further aspects of the present invention and further embodiments of the aspects described in the preceding paragraphs will become apparent from the following description, given by way of example and with reference to the accompanying drawings.

BRIEF DESCRIPTION OF THE DRAWINGS

The invention will be described with reference to the drawings, in which:

FIG. 1 illustrates a fractional-N PLL according to an embodiment of the invention;

FIGS. 2A-D illustrate example fractional phase predictors according to embodiments of the invention;

FIG. 5 illustrates a fractional-N PLL with sleep modes according to embodiments of the invention;

DETAILED DESCRIPTION

Figure 3:
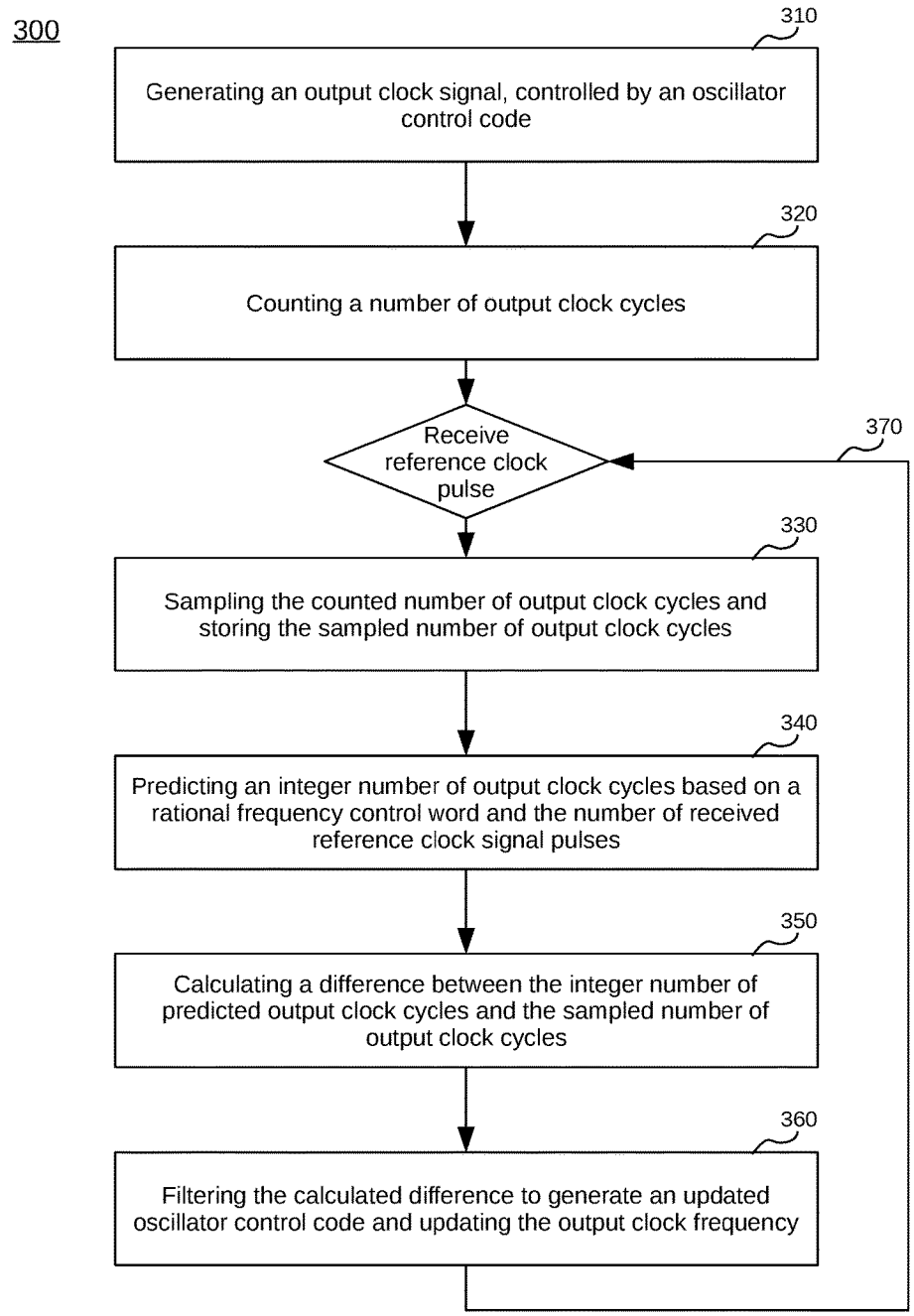
FIG. 3 illustrates a method for generating an output clock signal whose phase is locked to a reference clock signal phase by a rational number according to an embodiment of the invention.

Phase-Locked Loops (PLLs) are circuits that produce an output clock signal whose phase is locked to the phase of a reference clock input signal. Phase, in the context of a PLL, means a signal's frequency value integrated over time, i.e., the signal's accumulated number of clock pulses. The ratio of the frequency of the output clock signal and the frequency of the reference clock signal can be a positive integer number, in which case the PLL is called an integer-N PLL; or it can be a positive rational number, in which case the PLL is called a fractional-N PLL. Rational numbers are numbers that can be expressed as a ratio of two integers. In the context of this document, a fractional-N number is a positive rational number consisting of an integer part (obtained by rounding down to the nearest integer number) and a fractional part.

A digital PLL may measure the output clock phase, and compare the measured phase with a required or predicted phase. The required ratio is sometimes referred to as or obtained from a frequency control word (FCW). The ratio of oscillator output clock cycles to input reference clock cycles is called the PLL's multiplication factor. When a PLL is in lock, its multiplication factor matches its FCW. Embodiments of the invention perform measurement of the output phase by counting the output clock cycles in a modulo-K counter, which accumulates fully completed (i.e., integer) cycles only. A fractional phase predictor generates an integer comparison phase, based on the reference clock and a fractional-N FCW. The embodiments performs phase comparison using a digital subtractor (or adder). They filter the comparison result in a loop filter, and use the loop filter output to control the oscillator. Embodiments of the invention are related to (but different than) an earlier fractional-N PLL with a time-to-digital converter described in U.S. Pat. No. 8,994,523, entitled Phase-Locked Loop Apparatus and Method by Jenkins, which relied on rational rather than integer phase comparison.

A modulo-K counter, for the purposes of this patent document, is a counter that counts up to K pulses at an input, providing a counted value at an output, restarting at a start value upon counting every $K^{th}$ pulse. A modulo-K counter may count up or count down. The start value may be zero, or any other value. The counted value may be expressed as a binary number, or in any other representation of a number. Examples in this patent document are based on up-counting from a value 0 to a value K−1, after which the counter restarts at 0. However, mutatis mutandis, all examples are equally valid for counters counting down or starting at different values. The value of K may be fixed, or it may be programmable, or it may be made to vary over time.

FIG. 1 illustrates a fractional-N PLL 100 according to an embodiment of the invention. PLL 100 receives reference clock signal 101 and produces output clock signal 102. The frequency ratio of output clock signal 102 and reference clock signal 101 is determined by a fractional-N FCW that includes integer number N 103 and fraction of N 104. Controlled oscillator 110 produces output clock signal 102. Modulo-K counter 120 accumulates the controlled oscillator 110 frequency by counting cycles of output clock signal 102. Therefore, the modulo-K counter 120 output signal (at 105) is representative for the phase of output clock signal 102. Upon receiving a reference clock signal 101 pulse, register 130 samples phase 105, stores it, and makes it available as sampled phase 106. Register 130 may include a set of parallel latches, for example D-latches with enable and data inputs, each latch for one bit of the phase 105 code word, each latch triggered by reference clock signal 101, and each latch providing one bit of the sampled phase 106 code word.

Fractional phase predictor 140 takes integer number N 103 and fraction of N 104, and upon receiving a reference clock signal 101 pulse, fractional phase predictor 140 calculates predicted phase 107 as explained later with reference to FIGS. 2A-D. Although fractional phase predictor 140 receives a fractional-N FCW, embodiments may output predicted phase signal 107 as only an integer number. Subtractor 150 calculates a difference 108 between a required phase and a measured phase by subtracting sampled phase 106 from predicted phase 107. Loop filter 160 integrates and filters difference 108 to produce oscillator control code 109, which controls the frequency of output clock signal 102.

The fractional-N FCW includes integer number N 103, which may have any integer value below a maximum $R_N$, where $R_N$ stands for the range of integer number N 103. It further includes fraction of N 104, which may be expressed as an integer value M below a maximum $R_M$, where $R_M$ stands for the range of fraction of N 104. The PLL 100 multiplication factor is $f_{out}/f_{ref}=(N+M/R_M)$.

Modulo-K counter 120 and fractional phase predictor 140 need to be able to track the phase of the output clock signal over a sufficiently large range. For modulo-K counter 120 this range equals K: upon reaching a counted value of K−1, the counter continues counting at 0. Naturally, the range K needs to be large enough to count $R_N$ cycles of output clock signal 102 during one cycle of reference clock signal 101. To correct large phase errors, or to relock at the correct phase after lock has been temporarily lost, embodiments of the invention may use a large range K, for instance K>>$R_N$. For example, the range K of the modulo-K counter may be at least two times larger than a maximum number of output clock signal cycles $R_N$ during a reference clock signal cycle. Thus, the maximum value of a phase error is not limited by the period of reference clock signal 101, but by the larger of K and a range of fractional phase predictor 140. The range of fractional phase predictor 140 is clarified with reference to FIG. 2A.

FIG. 1 shows fractional-N PLL 100 as an example embodiment with up-counting modulo-K counter 120 and an up-counting fractional phase predictor 140. Other embodiments may use a down-counter and/or a down-counting fractional phase predictor. Counting limits may be chosen different than 0 and K, for example K and 0, or 0 and −K, or any other set of integer values that differ by K. Some embodiments may use an adder instead of a subtractor, and calculate the sampled phase as a negative value.

In an embodiment alternative to FIG. 1, subtractor 150 is omitted. The fractional phase predictor outputs a series of integer numbers whose average equals the FCW determined by N (103) and fraction of N (104). The embodiment programs the value of K in modulo-K counter 120 to be equal to the output number of the fractional phase predictor. Modulo-K counter 120 counts down from the pre-programmed K to zero. Upon achieving zero, modulo-K counter 120 presets to the next K value that is output by the fractional phase predictor. The embodiment interprets a counter output value that is in a range below K as a negative number, meaning that the controlled oscillator frequency is higher than the K times the reference clock signal 101 frequency. In yet another alternative embodiment, the K value is programmed similarly, however, the counter counts down between K/2 and −K/2.

FIGS. 2A-D illustrate example fractional phase predictors 200A-D according to embodiments of the invention. If fractional-N PLL 100 is in lock, then $f_{out}/f_{ref}$=FCW=(N+M/$R_M$). It follows that after c cycles of reference clock signal 101, there should be c×FCW cycles of output clock signal 102. A fractional phase predictor takes a fractional-N FCW, but it outputs an integer predicted phase, therefore, the predicted phase may have the value round (c×FCW). Thus, the predicted phase includes quantization noise. The range of a fractional phase predictor is determined by the maximum value that the predicted phase can have, i.e. the maximum value of round (c×FCW).

A most basic embodiment of a fractional phase predictor, as will also be shown in FIG. 2B, is a fractional-N accumulator, whose output bits are truncated to carry only the integer result of the accumulation. However, simple truncation may introduce a quantization noise spectrum that causes unacceptable output clock jitter in some applications. Therefore, we prefer to view the fractional phase predictor from the perspective described below. All embodiments receive the fractional-N FCW that includes integer number N 103 and fraction of N 104, as well as reference clock signal 101. They all output the predicted phase 107 as an integer number.

FIG. 2A illustrates a general embodiment 200A of fractional phase predictor 140. General embodiment 200A includes an integer-N accumulator comprising adder 201 and register 202. Adder 202 adds integer number N 103, predicted phase 107, and interpolated value 222 to produce sum 221. Upon receiving a reference clock signal 101 pulse, register 202 samples sum 221, stores it, and outputs it as an updated value of predicted phase 107. Interpolator 203 receives fraction of N 104 and outputs interpolated value 222. Interpolator 203 may provide dithering or noise shaping to change the quantization noise spectrum and move part of the quantization noise energy from low frequencies to higher frequencies. This is advantageous for fractional-N PLL 100 in FIG. 1, because loop filter 160 will generally be more effective in removing high-frequency noise than low-frequency noise, as a result of which controlled oscillator 110 will deliver a more stable output clock signal 102. Interpolator 203 may provide dithering or noise shaping through any method known in the art, for example using a sigma delta modulator, a bandpass sigma delta modulator, parallel sigma delta modulators, a multistage noise shaping (MASH) modulator, a sturdy MASH (SMASH) modulator, etc.

FIG. 2B illustrates an example fractional phase predictor 200B according to an embodiment of the invention, wherein the interpolator comprises a first order MASH modulator. Items 201 and 202, as well as signals 221 and 222 are the same as in FIG. 2A. Interpolator 203 is implemented as an accumulator of fraction of N 104, comprising adder 204 and register 205. Adder 204 sums fraction of N 104 and accumulated fraction 224 to produce sum 223. Upon receiving a reference clock signal 101 pulse, register 205 samples sum 223, stores it, and outputs it as an updated value of accumulated fraction 224. When adder 204 overflows, it outputs a carry signal as interpolated value 222 for adder 201.

MASH modulators have been well covered in the art. They were first described by T. Hayashi, Y. Inabe, K. Uchimura, and A. Iwata in "A multi stage delta-sigma modulator without double integration loop" (ISSCC Digest of Technical Papers, pp. 182-183, 1986). FIGS. 2C and 2D illustrate embodiments 200C and 200D of the invention using second and third order MASH modulators. Further embodiments may implement even higher order MASH implementation. Basically, each higher order implementation of a MASH modulator adds a stage that takes quantization noise remaining from the previous stage and moves it up to higher frequencies. Some embodiments of the invention will work as required by an application just by implementing a first order MASH interpolator, whereas other embodiments may require a second or higher order MASH or other modulator.

Although the example fractional phase predictors in FIGS. 2A-D have been described with adders to calculate a positive integer predicted phase 107, other embodiments may use subtractors and other elements to calculate the same result or to calculate a negative integer value for predicted phase 107. All such variations are within the ambit and scope of the present invention.

FIG. 3 illustrates a method 300 for generating an output clock signal whose phase is locked to a reference clock signal phase by a rational number according to an embodiment of the invention. Method 300 comprises the following steps.

Step 310—in a controlled oscillator, generating an output clock signal, wherein an output clock frequency is controlled by an oscillator control code.

Step 320—in a modulo-K counter, counting a number of output clock cycles. The modulo-K counter may count up or down, between a minimum value, for example 0, and a maximum value, for example K−1. Once it has reached the maximum (or minimum) value, it continues counting at the minimum (or maximum) value, respectively. In some embodiments, the value of K may be much higher than a maximum value of the rational number, for example, at least two times higher.

Step 330—upon receiving a reference clock signal pulse, sampling the counted number of output clock cycles and storing the sampled number of output clock cycles in a register.

Step 340—upon receiving the reference clock signal pulse, calculating an integer number of predicted output clock cycles based on an integer number representing the reference clock signal phase and a rational frequency control word number. Embodiments may perform the calculation by accumulating at least part of the frequency control word for each newly received reference clock signal pulse. The reference clock signal phase is determined by the number of received reference clock signal pulses. An embodiment may increment the number of predicted output clock cycles with the value of the frequency control word each time it receives a reference clock signal pulse; therefore, the number of predicted output clock cycles will equal the reference clock signal phase times the frequency control word. Embodiments may further perform noise shaping by shifting quantization noise to higher frequencies, for example by using delta sigma modulators or MASH modulators. Steps 330 and 340 may occur in either order or in parallel.

Step 350—calculating a difference between the integer number of predicted output clock cycles and the sampled number of output clock cycles, and forwarding the difference to a digital loop filter.

Step 360—in the digital loop filter, filtering the calculated difference to generate an updated oscillator control code, and in the controlled oscillator, updating the output clock frequency. The digital loop filter may have any frequency and phase transfer function as usual or as known in the art of PLL design provided that the transfer function enables PLL stability. In embodiments, filter parameters in the digital loop filter may be fixed or programmable.

Step 370—upon receiving successive reference clock signal pulses, updating the sampled number of output clock cycles and the predicted output clock cycles to provide the controlled oscillator updated oscillator control codes to lock the output clock signal phase to the reference clock signal phase.

Figure 4:
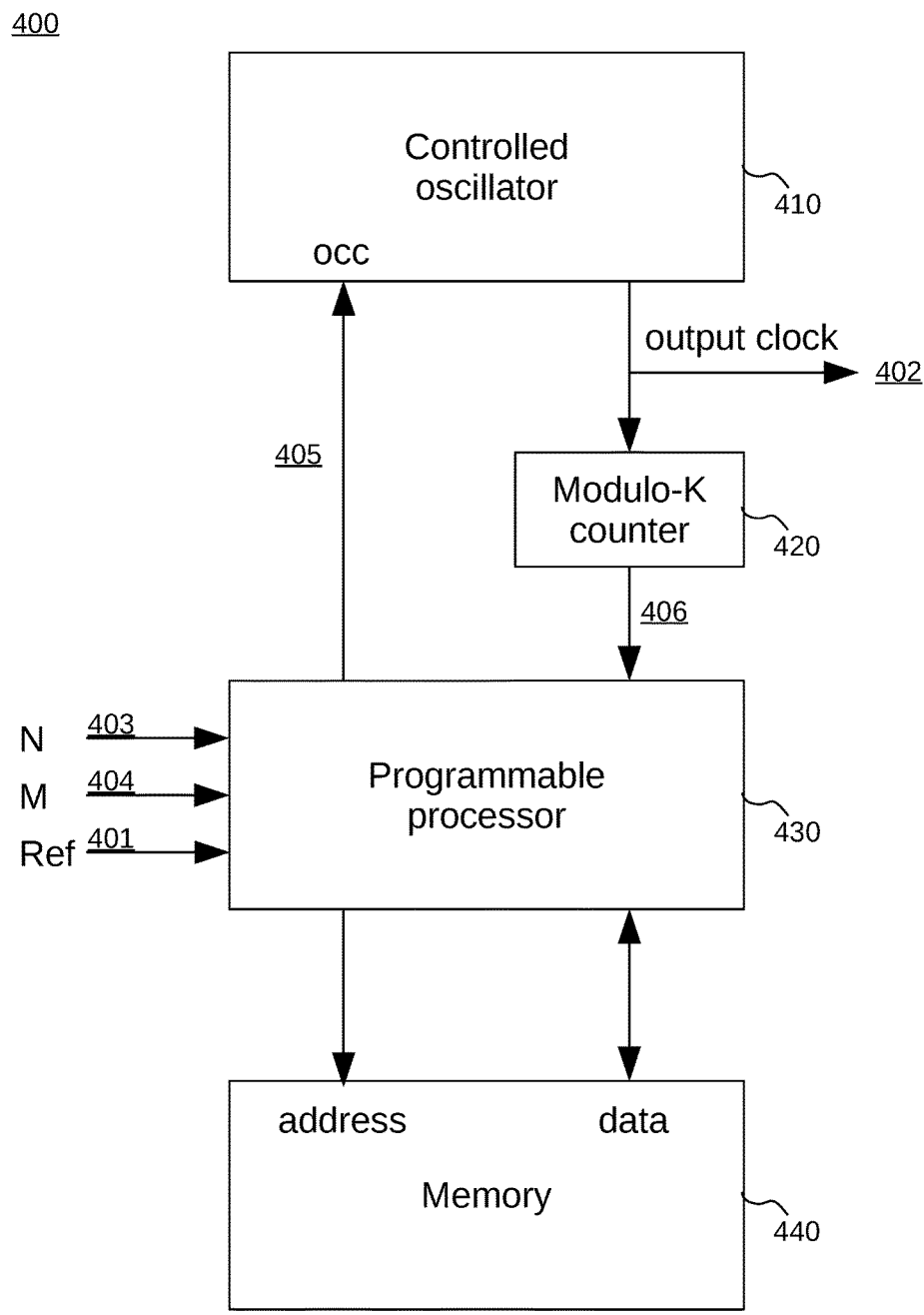
FIG. 4 illustrates a programmable system capable of implementing PLL methods according to embodiments of the invention.

FIG. 4 illustrates a programmable system 400 capable of implementing PLL methods according to embodiments of the invention. System 400 is a PLL that comprises a controlled oscillator 410, a modulo-K counter 420, a programmable processor 430, and a memory 440. Programmable system 400 is configured to store software instructions and/or data in memory 440. Programmable processor 430 receives reference clock signal 401, and a FCW comprising integer part N 403 and fractional part M 404. Programmable processor 430 outputs oscillator control code 405 to controlled oscillator 410. Controlled oscillator 410, whose frequency is controlled by oscillator control code 405, outputs the output clock 402. Modulo-K counter 420 counts cycles of output clock 402, and its output signal 406 is a measure for the output clock phase, which it feeds back to programmable processor 430. Some embodiments may store integer part N 403 and fractional part M 404 as parameters in memory 440, either as part of the software instructions or as part of the data. Further embodiments may receive multiple reference clock signals, and may work with multiple FCWs. Yet further embodiments may use separate memories for software instructions and data.

Programmable processor 430 may, for example, be programmed to execute instructions for the following operations:

(a) upon receiving a reference clock signal 401 pulse, sampling a modulo-K counter 420 output value 406 and storing the output value 406 as a sampled phase in a register;

(b) upon receiving the reference clock signal 401 pulse, calculating an integer number of predicted output clock cycles based on an integer number representing a reference clock signal phase and a rational number representing a FCW;

(c) calculating a difference between the integer number of predicted output clock cycles and the sampled phase;

(d) integrating and filtering the calculated difference to generate an updated oscillator control code; and (e) upon receiving a successive reference clock signal pulse, updating the sampled phase and the number of predicted output clock cycles to provide the controlled oscillator updated oscillator control codes to lock the output clock signal phase to the reference clock signal phase.

FIG. 5 illustrates a fractional-N PLL 500 with sleep modes according to embodiments of the invention. Some embodiments, capable of maintaining phase lock over a sleep period (ignoring the reference clock during the sleep period), feature gated output clock signal 502A. Other embodiments, capable of maintaining approximate frequency lock while free-running during a partial sleep period, feature ungated output clock signal 502B. Yet other embodiments feature both gated output clock signal 502A and ungated output clock signal 502B.

PLL 500 is similar to PLL 100 of FIG. 1, with the addition of sleep mode control signals $\overline{Sleep1}$ (505) and $\overline{SleepOsc}$ (506) and associated gates 522 and 528. A line above a signal name indicates that the signal is asserted when it is low. PLL 500 has the following modes: active, first sleep, and in some embodiments also second sleep. In active mode, the signals $\overline{Sleep1}$ (505) and $\overline{SleepOsc}$ (506) are de-asserted. In first sleep mode, the signal $\overline{Sleep1}$ (505) is asserted and $\overline{SleepOsc}$ (506) is de-asserted. In second sleep mode, both signals $\overline{Sleep1}$ (505) and $\overline{SleepOsc}$ (506) are asserted. In active mode, PLL 500 operates the same as PLL 100. In the example embodiment drawn, $\overline{Sleep1}$ (505) may be changed synchronously to reference clock signal 501.

In active mode, controlled oscillator 520 oscillates, and its output signal, which may be available as ungated output clock signal 502B, passes through gate 522, which may comprise an AND gate as shown in this example, to gated output clock signal 502A and to modulo-K counter 524.

Modulo-K counter 524 calculates the controlled oscillator 520 phase 508 by counting cycles of gated output clock signal 502A. Upon receiving a reference clock signal 501, passing through gate 528, which may comprise an AND gate as shown in this example, register 526 samples phase 508, stores it, and makes it available as sampled phase 509. Register 526 may include a set of parallel latches, for example D-latches with enable and data inputs, each latch for one bit of the phase 508 code word, each latch triggered by gated reference clock 510, and each latch providing one bit of the sampled phase 509 code word.

Fractional phase predictor 530 takes integer number N 503 and fraction of N 504 (together a fractional-N FCW), and upon receiving gated reference clock signal 510, fractional phase predictor 530 calculates predicted phase signal 511 such as was explained in detail with reference to FIGS. 2A-D. Although fractional phase predictor 530 receives a fractional-N FCW, embodiments may output predicted phase signal 511 as only an integer number. Subtractor 532 calculates a difference 512 between a required phase and a measured phase by subtracting sampled phase 509 from predicted phase 511. Loop filter 534 integrates and filters difference 512 to produce oscillator control code 513, which controls the controlled oscillator 520's frequency.

The fractional-N FCW includes integer number N 503, which may have any integer value below a maximum $R_N$, where $R_N$ stands for the range of integer number N 503. It further includes fraction of N 504, which may have any integer value M below a maximum $R_M$, where $R_M$ stands for the range of fraction of N 504. The PLL 500 multiplication factor is $f_{out}/f_{ref}=(N+M/R_M)$.

Modulo-K counter 524 and fractional phase predictor 530 need to be able to track the phase of the output clock over a sufficiently large range. For modulo-K counter 524 this range equals K: upon reaching a counted value of K−1, the counter continues counting at 0. Naturally, the range K needs to be large enough to count $R_N$ cycles of gated output clock signal 502A during one cycle of gated reference clock 510. To correct large phase errors, or to relock at the correct phase after lock has been temporarily lost, embodiments of the invention may use a large range K, for instance $K \gg R_N$. For example, the range K of the modulo-K counter may be at least two times larger than a maximum number of output clock signal cycles $R_N$ during a reference clock signal cycle. Thus, the maximum value of the phase error is not limited by the period of the reference clock signal 501, but by the larger of K and the range of fractional phase predictor 530.

First sleep mode commences when signal $\overline{Sleep1}$ (505) is asserted, for example, as drawn when it is pulled low. At that time, gate 528 blocks reference clock signal 501, and gate 522 blocks gated output clock signal 502A. Therefore, modulo-K counter 524 receives no clock cycles to count, and fractional phase predictor 530 and register 526 do not update. As a result, the embodiment uses less power in modulo-K counter 524, register 526, fractional phase predictor 530, subtractor 532, and loop filter 534. Signal $\overline{SleepOsc}$ (506) may subsequently be asserted to enter second sleep mode and stop controlled oscillator 520 to save further power.

Signal $\overline{SleepOsc}$ (506) is de-asserted no later than signal $\overline{Sleep1}$ (505) is de-asserted, i.e., oscillator 520 is started no later than reference clock signal 501 and output clock signal 502 are (re-)enabled. By starting controlled oscillator 520 early and by stopping it late with reference to signal $\overline{Sleep1}$ (505), a user can isolate gated output clock signal 502A from controlled oscillator 520 start-up or power-down behavior.

To maintain phase accuracy, signal $\overline{\text{Sleep1}}$ (505) must be asserted and de-asserted synchronously to reference clock signal 502. Some embodiments may enforce synchronicity by passing signal $\overline{\text{Sleep1}}$ (505) to a D-latch 536 enabled by reference clock signal 501, and using a D-latch output signal 505A as an input signal for gates 528 and 522.

An embodiment of example fractional-N PLL 500 that does not require synchronicity of signal $\overline{\text{Sleep1}}$ (505) to reference clock signal 501 may copy either sampled phase 509 or sampled phase 509 corrected for a current difference 512 (by subtracting the current difference 512 from sampled phase 509) to a register in fractional phase predictor 530 upon receiving the first reference clock signal 501 pulse after sleep mode, such that a discontinuity in phase difference is avoided and the updated difference 512 equals zero or the current difference 512. For example, an embodiment using the fractional phase predictor 200A in FIG. 2A may copy the sampled phase 509 in FIG. 5 to register 202 in FIG. 2A. Or the embodiment may correct sampled phase 509 by subtracting a current difference 512 and copy the corrected value to register 202. However, in such an embodiment, example fractional-N PLL 500 only maintains approximate frequency lock but not phase lock over the sleep mode period.

FIG. 5 shows example fractional-N PLL 500 as an embodiment with up-counting modulo-K counter 524 and an up-counting fractional phase predictor 530. Other embodiments may use a down-counter and/or a down-counting fractional phase predictor. Counting limits may be chosen different than 0 and K, for example K and 0, or 0 and −K, or any other set of values that differ by K. Some embodiments may use an adder instead of a subtractor, and calculate the sampled phase as a negative value. FIG. 5 shows example fractional-N PLL 500 as an embodiment with AND gates for gates 522 and 528, and with the signals $\overline{\text{Sleep1}}$ and $\overline{\text{SleepOsc}}$ asserted negative. A person having ordinary skill in the art will know that gating of reference clock signal 501 and output clock signal 502A can just as easily be achieved with another type of gate, such as a NAND gate, an OR gate, a NOR gate, an XOR gate, a pass gate, and a combination of any number of those gates, and with either one or both of the sleep signals asserted positive. Such embodiments are fully within the scope and ambit of the invention.

Whereas the use of gated output clock signal 502A allows keeping phase lock over a period of at least the first sleep mode, ignoring any reference clock cycles during the period, the use of ungated output clock signal 502B allows maintaining approximate frequency lock while free-running during the first sleep mode. Embodiments keep the loop filter 534 output at a fixed oscillator control code, approximately fixing the output clock signal 502B frequency. During first sleep mode, only controlled oscillator 520 is active, and example fractional-N PLL 500 can save power of operating the other included circuits.

Figure 6:
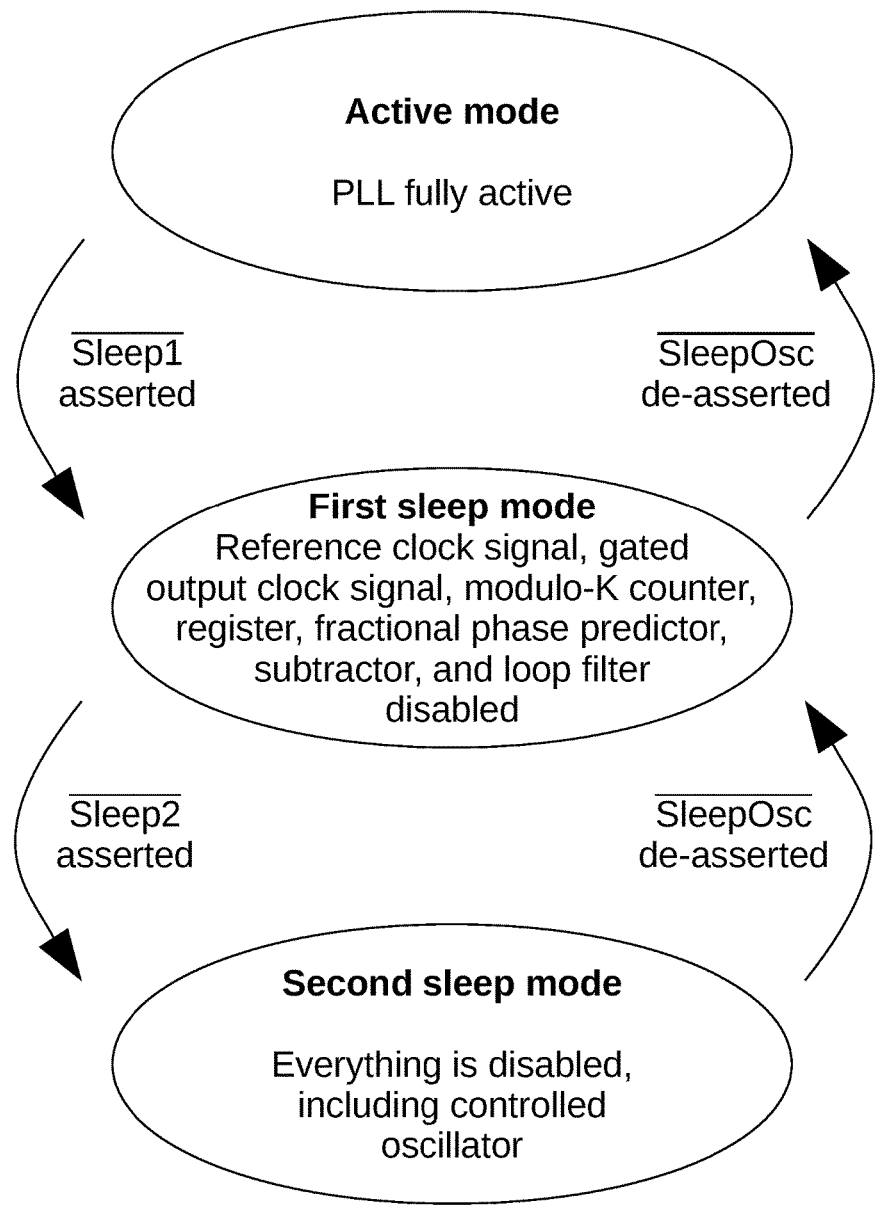
FIG. 6 illustrates a mode diagram according to an embodiment of the invention.

FIG. 6 illustrates a mode diagram 600 according to an embodiment of the invention.

Mode diagram 600 in FIG. 6 illustrates the modes in FIG. 5. There are three modes: active mode, first sleep mode, and (in some embodiments) second sleep mode. An embodiment transitions from the active mode to the first sleep mode when the signal $\overline{\text{Sleep1}}$ is asserted, and from the first sleep mode to active mode when the signal $\overline{\text{Sleep1}}$ is de-asserted. An embodiment that also has the second sleep mode transitions from the first sleep mode to the second sleep mode when the signal $\overline{\text{SleepOsc}}$ is asserted, and it transitions from the second sleep mode to the first sleep mode when the signal $\overline{\text{SleepOsc}}$ is de-asserted.

In the first sleep mode, the embodiment disables the reference clock signal, the gated output clock signal, the modulo-K counter, the register, the fractional phase predictor, the subtractor, and the loop filter. In the second sleep mode, it disables the same circuits as in the first sleep mode, as well as the controlled oscillator.

Figure 7:
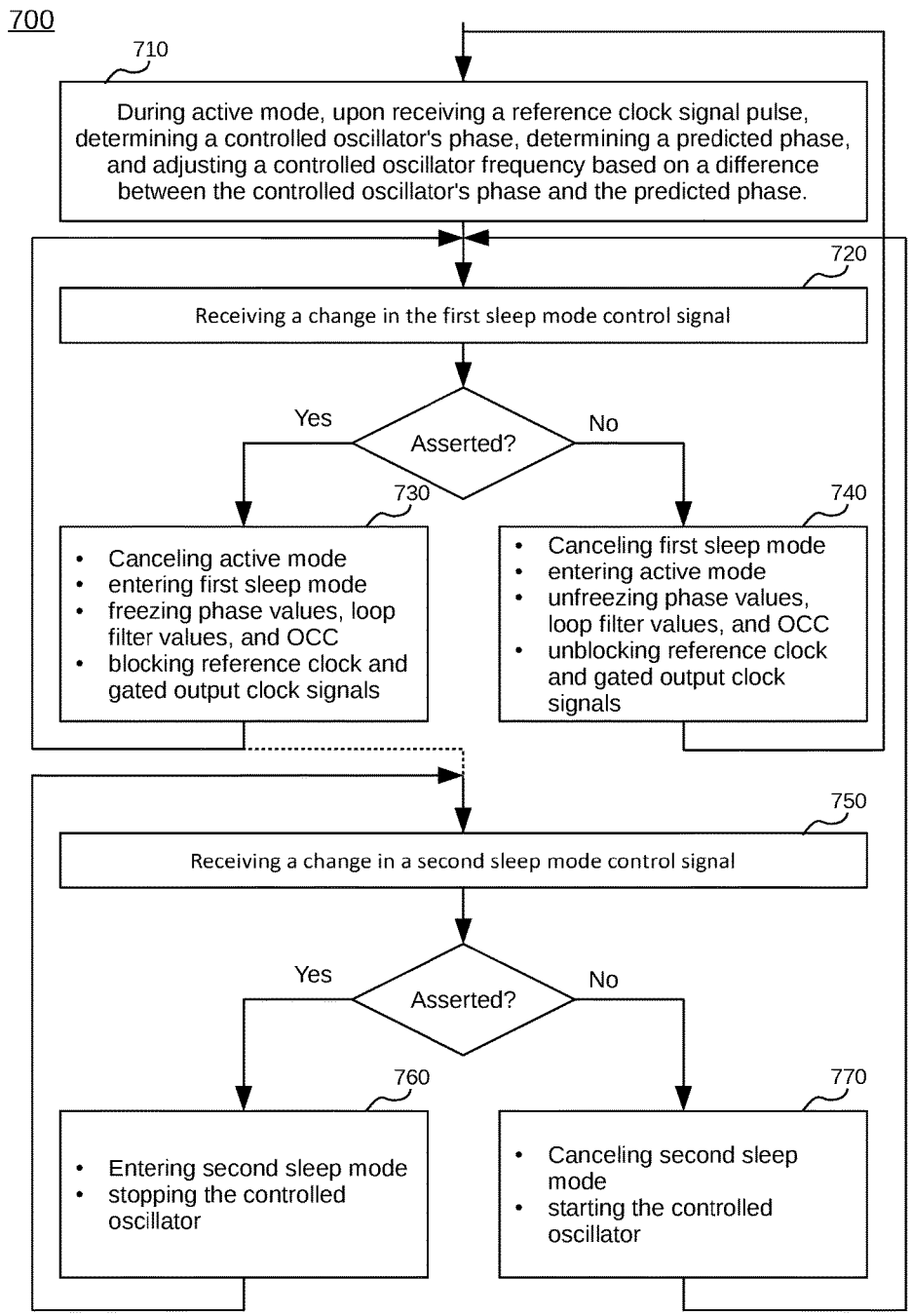
FIG. 7 illustrates a method to maintain phase lock and/or approximate frequency lock in a PLL over a sleep period according to an embodiment of the invention.

FIG. 7 illustrates method 700 to maintain phase lock and/or approximate frequency lock in a PLL over a sleep period, wherein the PLL has an active mode and at least a first sleep mode, and the PLL is configured to receive a reference clock signal and at least a first sleep mode control signal. Method 700 comprises the following steps.

Step 710—during active mode, upon receiving a reference clock signal pulse, determining a controlled oscillator's phase, determining a predicted phase, and adjusting a controlled oscillator frequency based on a difference between the controlled oscillator's phase and the predicted phase. An embodiment may sample the controlled oscillator's phase in a register and store it as an integer number. The embodiment may determine the predicted phase based on a fractional-N FCW and calculate the predicted phase as an integer number. The embodiment may perform noise shaping on the predicted phase.

Step 720—receiving a change in the first sleep mode control signal. In some embodiments, the change in the first sleep mode control signal may arrive synchronously with the reference clock signal.

Step 730—upon determining that the first sleep mode control signal is asserted:
    a. canceling the active mode
    b. entering the first sleep mode
    c. freezing sampled and predicted phase values, phase difference, loop filter internal values, and a resulting oscillator control code (OCC)
    d. blocking the reference clock signal and a gated output clock signal
    e. (optional) continuing to use an ungated output clock signal as a signal in approximate frequency lock with the reference clock signal
    f. continuing with step 720.

Step 740—upon determining that the first sleep mode control signal is not asserted:
    a. canceling the first sleep mode
    b. entering active mode
    c. unfreezing the sampled and predicted phase values, phase difference, loop filter internal values, and the resulting OCC
    d. unblocking the reference clock signal and the gated output clock signal, wherein the gated output clock signal may be used as a signal in phase lock with the reference clock signal
    e. continuing with step 710.

In embodiments in which the de-asserted first sleep mode control signal may arrive a-synchronously with the reference clock signal, step 740 may further comprise:
    determining an updated predicted phase by copying either an updated sampled phase or a corrected updated sampled phase to a register in a fractional phase predictor, wherein the corrected updated sampled phase includes the updated sampled phase minus a current difference.

Method 700 may additionally include the following steps:
Step 750—receiving a change in a second sleep mode control signal. Note that after step 730, an embodiment may receive either a change in the first sleep mode control signal (step 720) or in the second sleep mode control signal (step 750), and in both cases it responds correctly. This means that an embodiment, after step 730, may continue with either step 720 or step 750 as required by the sleep mode control signal that is changing. The embodiment monitors both signals in parallel.

Step 760—upon determining that the second sleep mode control signal is asserted:
 a. entering a second sleep mode
 b. stopping the controlled oscillator
 c. continuing with step 750.

Step 770—upon determining that the second sleep mode control signal is not asserted:
 a. canceling the second sleep mode
 b. starting the controlled oscillator
 c. continuing with step 720.

Figure 8:
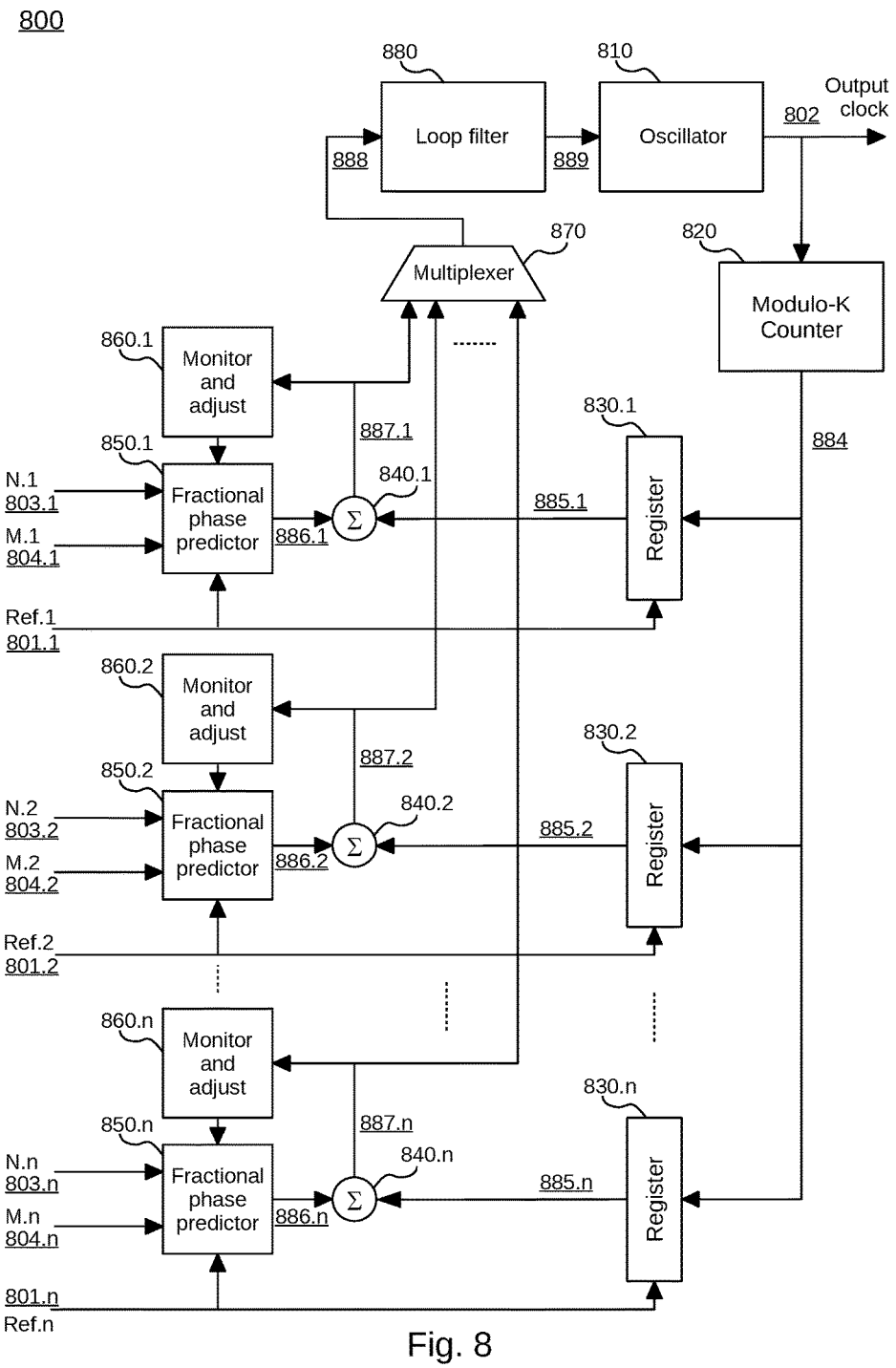
FIG. 8 illustrates a hitless switching multiple-loop PLL according to an embodiment of the invention.

FIG. 8 illustrates a hitless switching multiple-loop PLL 800 according to an embodiment of the invention. Some applications use multiple reference clock signals. This may for instance be the case when the best reference signal is not always available, but there are some backup reference signals that can be used instead. Or the system may have multiple active modes, where each mode provides its own reference clock signal. The reference clock signals may have different frequencies, and/or different reference clock signals may need multiplication with different FCWs.

The capability to switch between the different reference clock signals without facing a discontinuity in phase and therefore a possibly extended lock-in time is called hitless switching. An example hitless switching PLL is described in U.S. Pat. No. 9,007,105 by Jenkins. Some embodiments of the present invention, as described in the following, are related to the PLL in U.S. Pat. No. 9,007,105.

Multiple-loop PLL 800 features 2 or more parallel loops, each dedicated to one of the reference clock signals 801.1-801.n, and each taking a FCW comprising integer number N.x (803.x) and fraction M.x (804.x). Multiple-loop PLL 800 has the following common blocks, shared by all loops: controlled oscillator 810, modulo-K counter 820, multiplexer 870, and loop filter 880. The frequency of controlled oscillator 810 is controlled by oscillator control code 889. Controlled oscillator generates output clock signal 802, which is also an input signal for modulo-K counter 820 that measures an integer value for phase 884.

Each loop has an individual register 830.1-830.n, subtractor 840.1-840.n, fractional phase predictor 850.1-850.n, and monitor-and-adjust block 860.1-860.n. Each register 830.x, upon receiving a reference clock signal 801.x pulse, samples phase 884 and stores it as sampled phase 885.x. Each fractional phase predictor 850.x, upon receiving a reference clock signal 801.x pulse, calculates a predicted phase 886.x. Each subtractor 840.x subtracts sampled phase 885.x from predicted phase 886.x to calculate difference 887.x. Each difference 887.x is an input signal for multiplexer 870, which selects one of them and passes it to loop filter 880 as the selected difference 888. Loop filter 880 integrates and filters the selected difference 888 to produce oscillator control code 889.

Fractional phase predictors 850.x take integer numbers N 803.x and their fractions M 804.x (together forming fractional-N FCWs), and upon receiving a reference clock signal 801.x pulse, a fractional phase predictor 850.x calculates predicted phase 886.x as explained earlier with reference to FIGS. 2A-D. Although fractional phase predictor 850.x receives a fractional-N FCW, embodiments may output predicted phase signal 886.x as only an integer number.

Modulo-K counter 820 and fractional phase predictors 850.1-850.n need to be able to track the phase of the output clock over a sufficiently large range. For modulo-K counter 820 this range equals K: upon reaching a counted value of K−1, the counter continues counting at 0. Naturally, the range K needs to be large enough to count $R_N$ cycles of output clock signal 802 during one cycle of reference clock signal 801.x. To correct large phase errors, or to relock at the correct phase after lock has been temporarily lost, embodiments of the invention may use a large range K, for instance K>>$R_N$. For example, the range K of the modulo-K counter 820 may be at least two times larger than a maximum number of output clock signal cycles $R_N$ during a reference clock signal cycle. Thus, the maximum value of a phase error is not limited by the period of reference clock signal 801.x, but by the larger of K and a range of fractional phase predictor 850.x. The range of fractional phase predictors 850.x has been clarified with reference to FIG. 2A.

The monitor-and-adjust blocks 860.1-860.n are active only for loops that are not selected by multiplexer 870. Monitor-and-adjust blocks 860.1-860.n monitor the differences 887.1-887.n from the respective subtractors 840.1-840.n and adjust registers (not shown) inside fractional phase predictors 850.1-850.n to minimize these differences 887.1-887.n.

A simple embodiment of a monitor-and-adjust block 860.x may just copy the sampled phase 885.x into the register (not shown, but for instance register 202 in FIG. 2A) inside fractional phase predictor 850.x so that the last prediction is effectively correct.

The monitor-and-adjust blocks 860.1-860.n are enabled only for fractional phase predictors 850.1-850.n that are not currently used for the active loop through multiplexer 870. Any adjustment in the currently active loop can break the desired relationship between input and output frequency. The function of a monitor-and-adjust block 860.x is to maintain the minimum phase error of currently unused reference clock signal 801.x, and indicate if its frequency is at the desired ratio to the output clock signal.

In embodiments of the invention, multiplexer 870 can be replaced by an averaging block that creates an error signal replacing selected difference 888 by averaging all the differences 887.1-887.n that are currently valid and whose monitor-and-adjust blocks 860.1-860.n have the difference 887.1-887.n associated with any valid reference clock signal 801.1-801.n close to zero. In this case, output clock signal 802 is effectively locked to all valid inputs and altering the members of the valid set has an even smaller impact on phase.

An embodiment can be optimized to have less circuitry. For example, instead of individual monitor-and-adjust blocks 860.1-860.n, an embodiment may have a single monitor-and-adjust block that cycles through fractional phase predictors 850.1-850.n, adjusting only one at a time.

FIG. 8 shows multiple-loop PLL 800 as an example embodiment with up-counting modulo-K counter 820 and an up-counting fractional phase predictors 850.1-850.n. Other embodiments may use a down-counter and/or down-counting fractional phase predictors. Counting limits may be chosen different than 0 and K, for example K and 0, or 0 and −K, or any other set of integer values that differ by K. Some embodiments may use adders instead of subtractors, and calculate the sampled phases as negative values.

Figure 9:
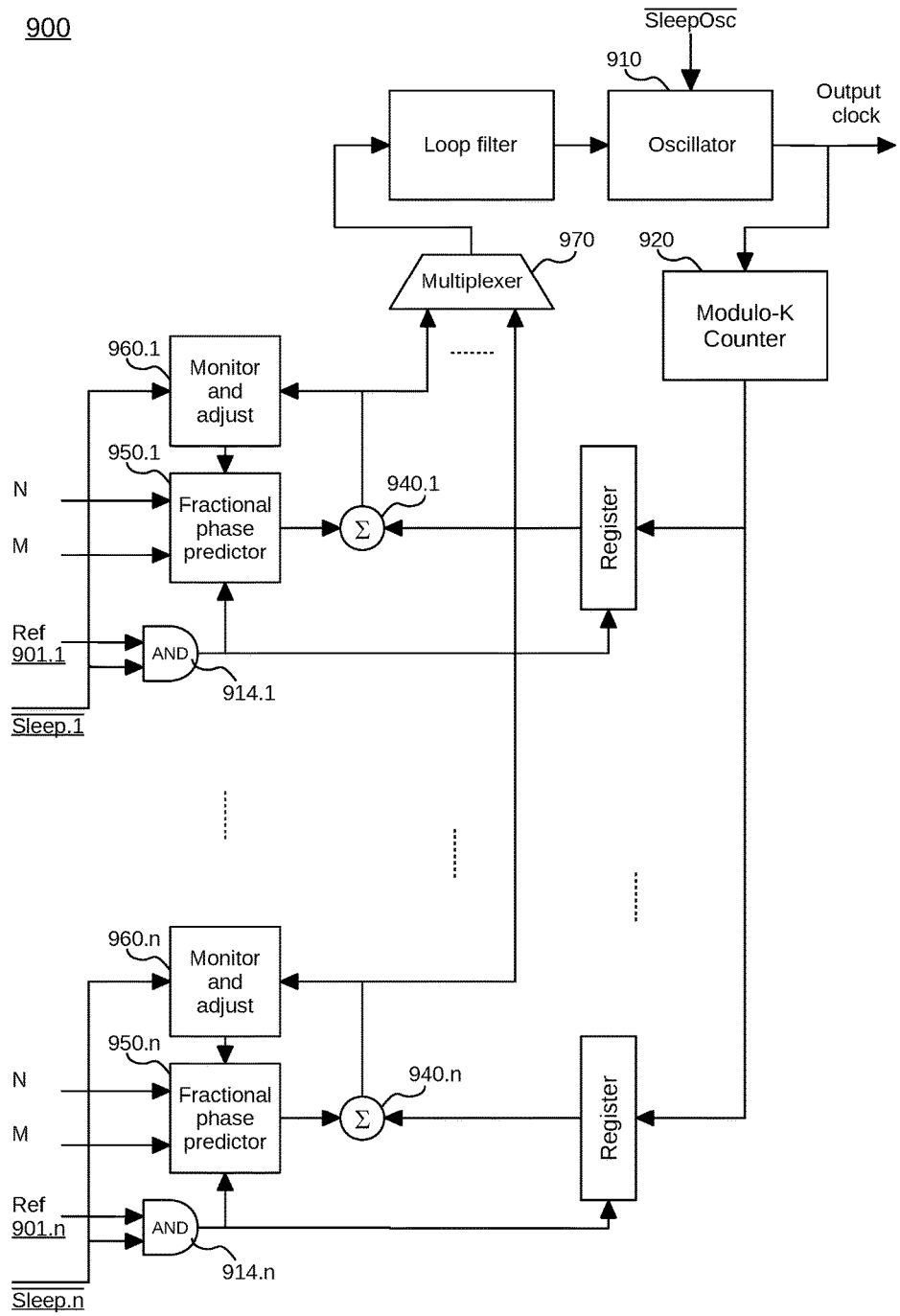
FIG. 9 illustrates a hitless switching multiple-loop PLL with sleep modes according to an embodiment of the invention.

FIG. 9 illustrates a hitless switching multiple-loop PLL 900 with sleep modes according to an embodiment of the invention. Multiple-loop PLL 900 is similar to multiple-loop PLL 800, with the addition of sleep mode(s). Each loop may have an extra input $\overline{\text{Sleep.x}}$, driving a gate 914.x, which may comprise an AND gate as shown in this example. Gate 914.x blocks reference clock signal 901.x in sleep mode, and passes it on in active mode. The $\overline{\text{Sleep.x}}$ signal further stops monitor-and-adjust block 960.x in sleep mode. Embodiments may allow each loop individually to enter a sleep mode or active mode. Whereas multiplexer 970 will select only one loop at a time, this does not necessarily mean that all other loops can be in sleep mode. For hitless switching to occur, a loop needs to be active even while it is not selected. However, if a loop has been active for at least once cycle of reference clock signal 901.x, then, as drawn in FIG. 9, hitless switching can occur.

The embodiment may further include sleep mode signal $\overline{\text{SleepOsc}}$, which can stop operation of controlled oscillator 910. This type of sleep mode impacts all loops, and fully halts operation of multiple-loop PLL 900.

FIG. 9 shows example multiple-loop PLL 900 as an embodiment with up-counting modulo-K counter 920 and an up-counting fractional phase predictors 950.x. Other embodiments may use down-counters and/or down-counting fractional phase predictors. Counting limits may be chosen different than 0 and K, for example K and 0, or 0 and –K, or any other set of integer values that differ by K. Some embodiments may use an adder instead of subtractor 940.x, and calculate the sampled phase as a negative value. FIG. 9 shows example multiple-loop PLL 900 as an embodiment with AND gates for gates 914.1-914.n, and with the signals $\overline{\text{Sleep1}}$ and $\overline{\text{SleepOsc}}$ asserted negative. A person having ordinary skill in the art will know that gating of reference clock signals 901.1-901.n can just as easily be achieved with another type of gate, such as a NAND gate, an OR gate, a NOR gate, an XOR gate, a pass gate, and a combination of any number of those gates, and with either one or both of the sleep signals asserted positive. Such embodiments are fully within the scope and ambit of the invention.

Figure 10:
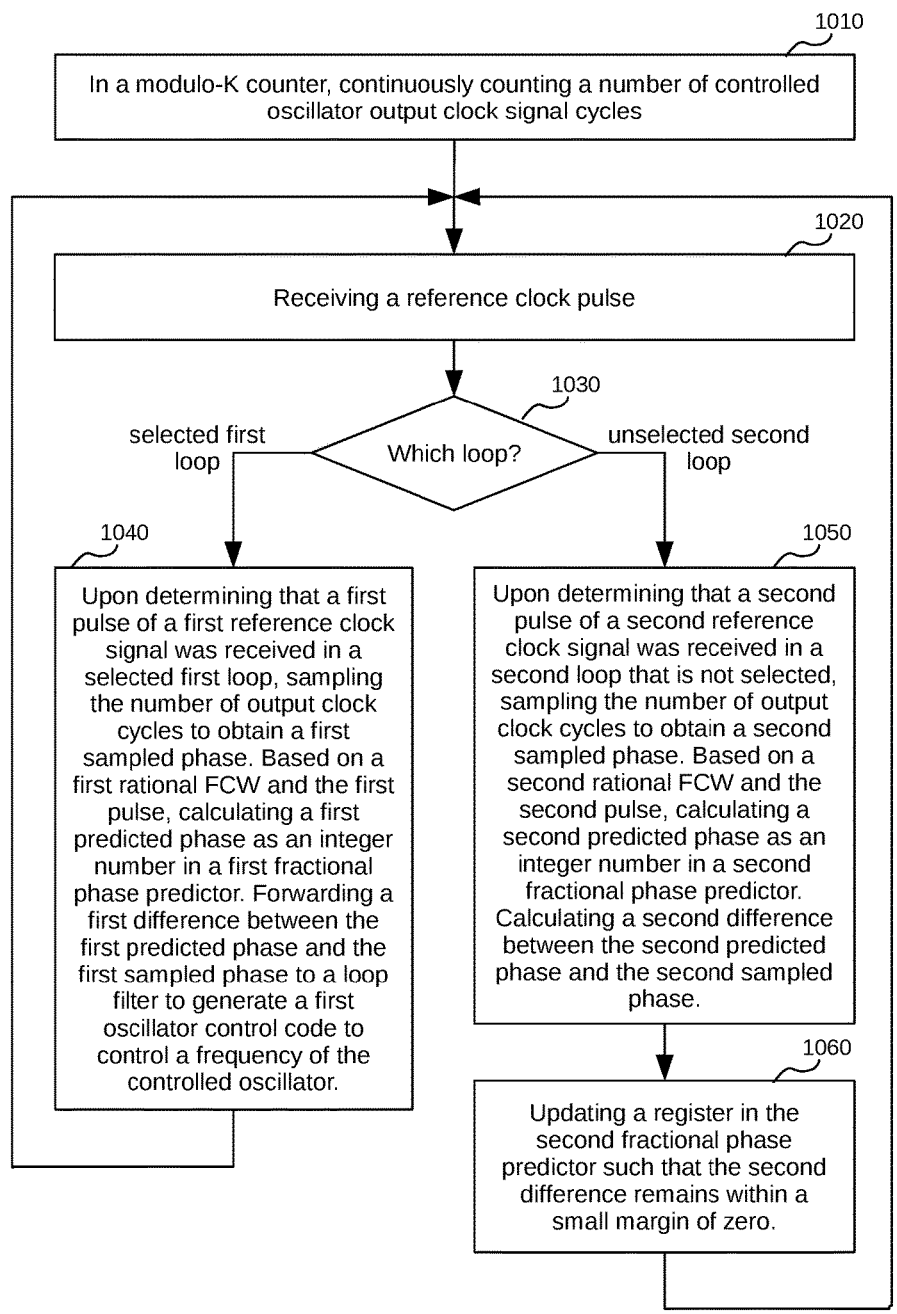
FIG. 10 illustrates a method for hitless switching in a multiple-loop PLL according to an embodiment of the invention.

FIG. 10 illustrates a method 1000 for hitless switching in a multiple-loop PLL according to an embodiment of the invention. Method 1000 comprises the following steps.

Step 1010—in a modulo-K counter, continuously counting a number of controlled oscillator output clock signal cycles.

Step 1020—receiving a reference clock pulse.

Step 1030—determining in which loop the reference clock was received.

Step 1040—upon determining that a first pulse of a first reference clock signal was received in a selected first loop, sampling the number of output clock cycles to obtain a first sampled phase. Based on a first rational FCW and the first pulse, calculating a first predicted phase as an integer number in a first fractional phase predictor. Forwarding a first difference between the first predicted phase and the first sampled phase to a loop filter to generate a first oscillator control code to control a frequency of the controlled oscillator. Continue with step 1020.

Step 1050—upon determining that a second pulse of a second reference clock signal was received in a second loop that is not selected, sampling the number of output clock cycles to obtain a second sampled phase. Based on a second rational FCW and the second pulse, calculating a second predicted phase as an integer number in a second fractional phase predictor. Calculating a second difference between the second predicted phase and the second sampled phase.

Step 1060—updating a register in the second fractional phase predictor such that the second difference remains within a small margin of zero. The small margin may be a margin that is calculated from the loop gain. The feedback loop in a PLL will operate to keep the first difference small, or generally the phase difference of the selected loop, where the maximum size of the difference depends on the loop gain. A larger gain will result in a smaller difference, therefore the margin is inversely proportional to the loop gain. Continue with step 1020.

Some embodiments may set the small margin at zero and simply copy the value of the second sampled phase into the register in the second fractional phase predictor.

Method 1000 may further comprise the following steps (not shown in FIG. 10):

Step 1070—upon receiving a loop sleep signal for the second loop: disabling updating of the second sampled phase, disabling the second fractional phase predictor.

Step 1080—upon receiving the loop sleep signal for the second loop: disabling a second monitor-and-adjust function.

Step 1090—upon receiving a PLL sleep signal, disabling the controlled oscillator.

Figure 11:
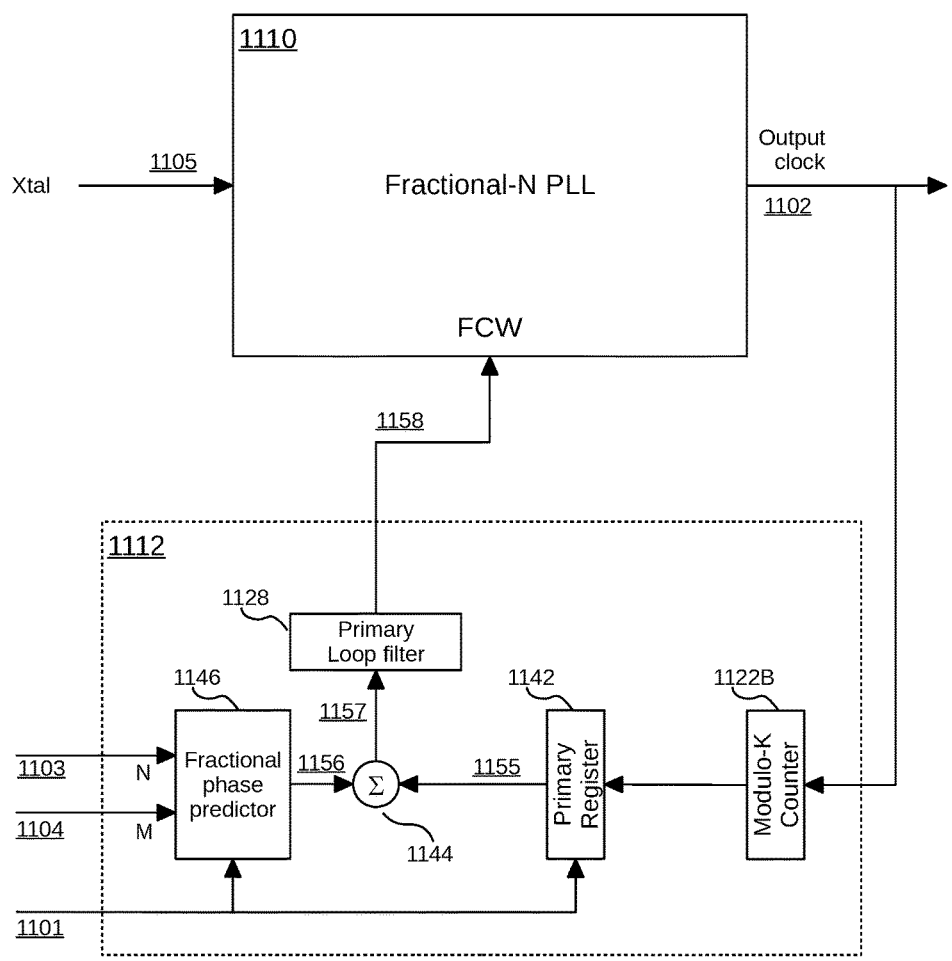
FIG. 11 illustrates a jitter attenuator according to an embodiment of the invention.

FIG. 11 illustrates a jitter attenuator 1100 according to an embodiment of the invention. The concept of a jitter attenuator is that a primary loop can lock to a primary reference clock signal with poor jitter behavior, whose frequency must be followed by an output clock signal, and that a secondary loop creates the actual output clock signal, based on the phase and stability of a secondary reference clock signal. By using different characteristics for loop filters for the primary loop and the secondary loop, embodiments can set different output clock phase noise spectra for the two different reference clock signal sources. For example, the active primary loop may determine the average frequency and lowest frequency phase noise, whereas the secondary loop may determine phase noise at higher frequencies. This can be accomplished by using a primary loop filter bandwidth that is much smaller than a secondary loop filter bandwidth, for example at least one hundred times smaller.

Jitter attenuator 1100 comprises a primary loop 1112 and a secondary loop 1110 which includes a fractional-N PLL. Primary loop 1112 includes a primary modulo-K counter 1122B whose input is coupled with a clock output of the fractional-N PLL in secondary loop 1110. A primary register 1142 has an input coupled with the primary modulo-K counter output, and a sample input that is clocked by a primary reference clock signal 1101 received at a primary reference clock signal 1101 input. Primary modulo-K counter 1122B measures the phase of the fractional-N PLL output clock signal 1102, and primary register 1142 samples the phase upon receiving a primary reference clock signal 1101 pulse to obtain sampled phase 1155. Primary loop 1112 further includes primary fractional phase predictor 1146, which has an input for primary reference clock signal 1101. Primary fractional phase predictor 1146 calculates a primary predicted phase 1156 upon receiving a primary reference clock signal 1101 pulse. Primary predicted phase 1156 includes an integer number and is based on a rational number primary frequency control word (FCW) that may include integer part 1103 (N) and fractional part 1104 (M). Primary subtractor or adder 1144 calculates an integer number primary difference 1157 between the primary predicted phase 1156 and the primary sampled phase 1155. Primary loop filter 1128 filters the primary difference 1157 to obtain secondary FCW 1158. Secondary FCW 1158 may include a rational number.

Secondary loop 1110 includes a first input which is configured for receiving a stable reference clock signal 1105, for example from a crystal oscillator, and a second input configured for receiving the secondary FCW 1158. Its output is configured to provide an output clock signal based on the stable reference clock signal and the secondary FCW.

Figure 12:
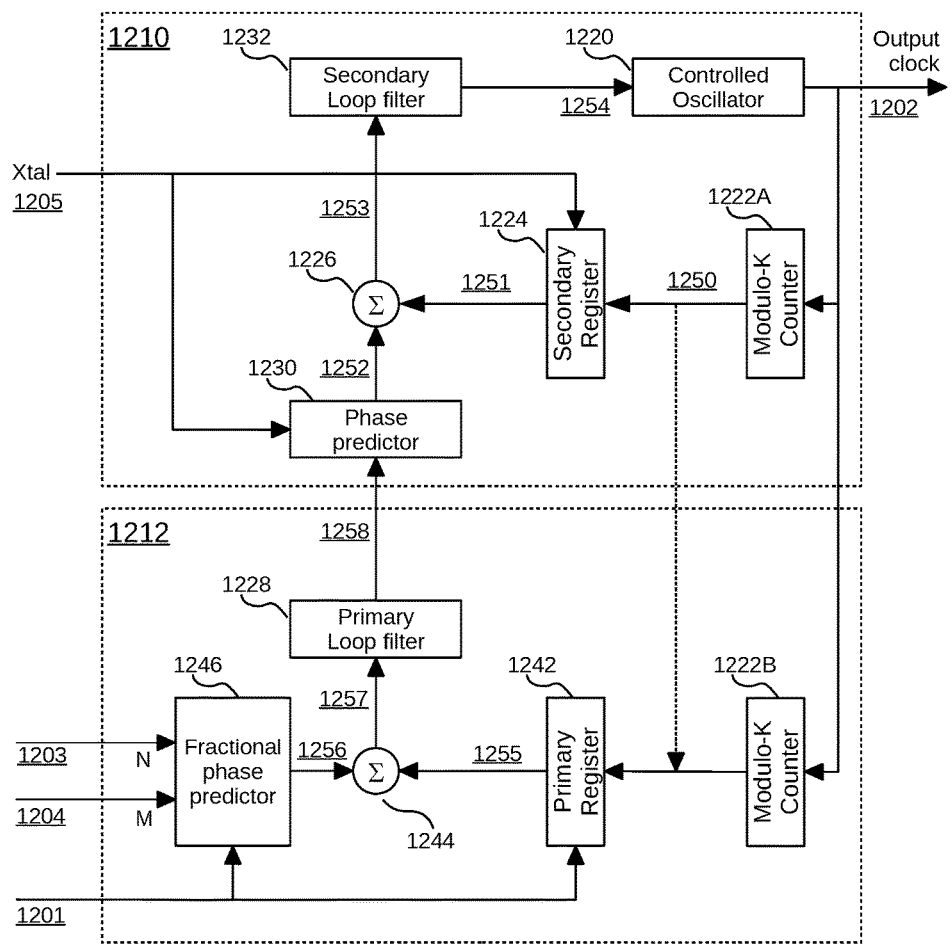
FIG. 12 illustrates additional details of a jitter attenuator according to some embodiments of the invention.

FIG. 12 illustrates additional details of jitter attenuator 1200 according to some embodiments of the invention. Jitter attenuator 1200 has an architecture similar to jitter attenuator 1100 in FIG. 11. Similar numbered blocks and signals in FIG. 12 have the same meanings and functions as in FIG. 11.

Its fractional-N PLL in secondary loop 1210 includes controlled oscillator 1220, modulo-K counter 1222A, secondary register 1224, phase predictor 1220, secondary subtractor or adder 1226, and secondary loop filter 1232. Controlled oscillator 1220 generates output clock signal 1202, which is also forwarded to modulo-K counter 1222A which outputs measured phase signal 1250. In some embodiments, modulo-K counter 1222A and 1225B may be combined into a single modulo-K counter, providing measured phase signal 1250 both to primary register 1242 and secondary register 1224. Secondary register 1224, upon receiving a secondary reference clock signal 1205 pulse, samples measured phase signal 1250 and delivers secondary sampled phase 1251 to secondary subtractor 1226. Phase predictor 1230, clocked by secondary reference clock signal 1205, calculates secondary predicted phase 1252. Secondary subtractor 1226 calculates a secondary difference 1253 between secondary predicted phase 1252 and secondary sampled phase 1251, and forwards secondary difference 1253 to secondary loop filter 1232, which integrates and filters secondary difference 1253 to provide oscillator control code 1254 to control the frequency of controlled oscillator 1220. The secondary sampled phase 1251, secondary predicted phase 1252, and secondary difference 1253 may be limited to integer numbers, as discussed in reference to earlier PLLs in this patent document, or they may include rational numbers as illustrated in FIG. 13.

Figure 13:
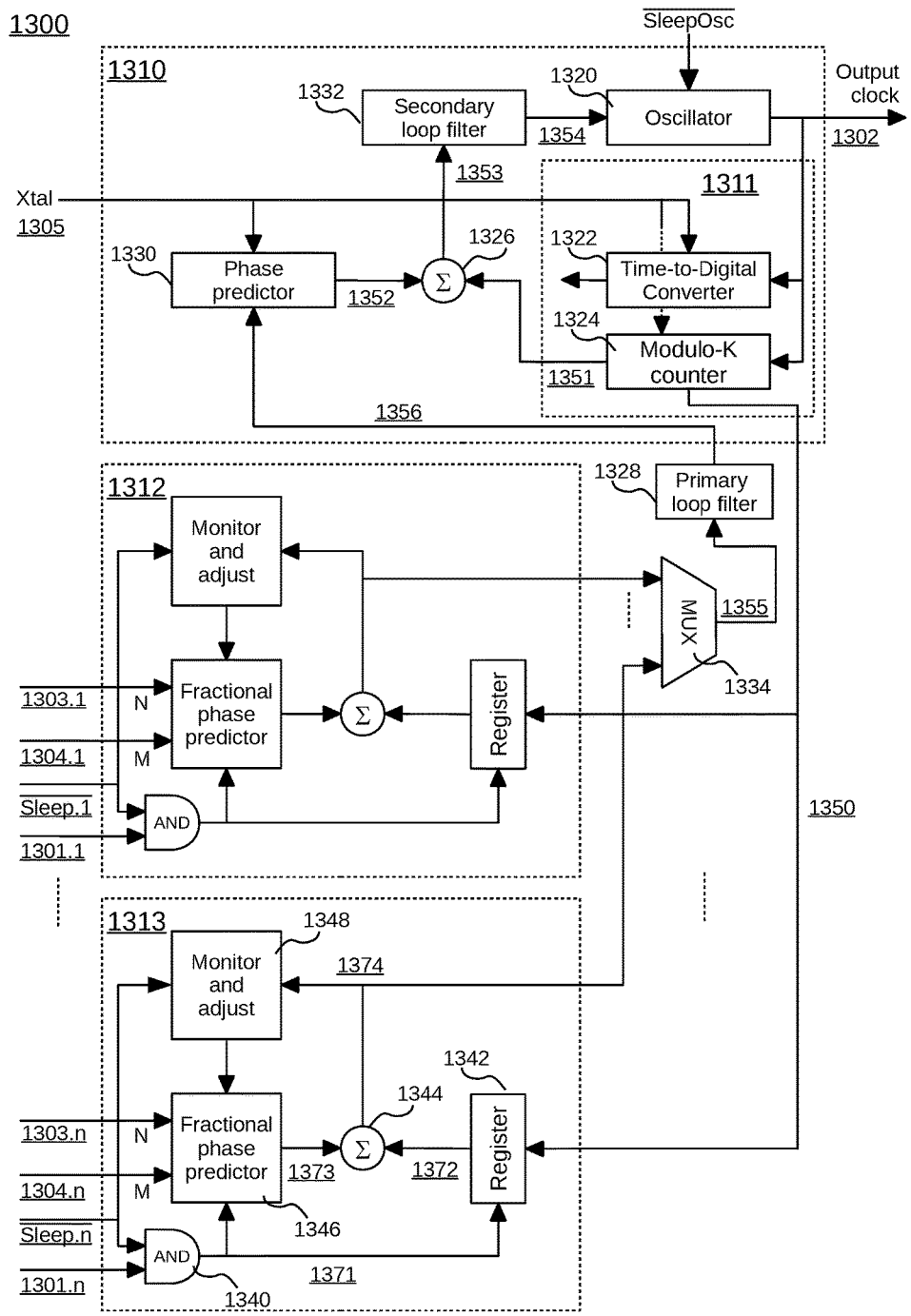
FIG. 13 illustrates details of a jitter attenuator with multiple primary loops according to an embodiment of the invention.

FIG. 13 illustrates details of a jitter attenuator 1300 with multiple primary loops according to an embodiment of the invention. It combines elements of the low-power hitless switching PLL in FIG. 9 with the jitter attenuator in FIG. 11 or 12. Jitter attenuator 1300 includes two or more parallel primary loops (shown in blocks 1312 and 1313) that share secondary loop 1310 functioning as a controlled oscillator. The primary loops have primary reference clock signal inputs 1301.1-1301.n, FCWs comprising integer part N 1303.1-1303.n and fractional part M 1304.1-1304.n. In some embodiments, one or more of the loops may also have an input for loop sleep signal $\overline{Sleep.1}$-$\overline{Sleep.n}$. The secondary loop has a secondary reference clock signal 1305 input, which may, for example, be coupled to a crystal oscillator, and an output for output clock signal 1302.

Each primary loop includes a primary register (e.g., 1342) to sample measured phase 1350 at the output of modulo-K counter 1324 upon receiving a gated reference clock signal (e.g., 1371) pulse. The gated reference clock signal is derived from a primary reference clock signal (e.g., 1301.n) and a sleep control signal (e.g., $\overline{Sleep.n}$) through one or more logic gates, e.g., gate 1340. The primary register delivers a primary sampled phase (e.g., 1372) at its output.

A fractional phase predictor (e.g., 1346) calculates an integer primary predicted phase (e.g., 1373) based on a rational FCW, e.g., including integer part N 1303.n and fractional part M 1304.n, and based on the number of gated reference clock signal pulses received via the one or more logic gates, e.g., gate 1340. A primary subtractor, e.g., 1344, subtracts the primary sampled phase from the primary predicted phase to obtain an integer primary phase difference (e.g., 1374). The embodiment provides the primary phase difference to a monitor and adjust block or function (e.g., 1348) and to multiplexer 1334. Multiplexer 1334 selects an active primary loop by passing its primary phase difference (e.g., 1374) as the selected primary phase difference 1355 to primary loop filter 1328, which calculates secondary FCW 1356 for the secondary loop 1310.

Secondary loop 1310 includes controlled oscillator 1320, modulo-K counter 1324 including a secondary register (not drawn) to output secondary sampled phase 1351, phase predictor 1330, secondary subtractor or adder 1326, and secondary loop filter 1332. Controlled oscillator 1320 generates output clock signal 1302, which is also forwarded to modulo-K counter 1324, which further outputs measured phase 1350. The secondary register, upon receiving a secondary reference clock signal 1305 pulse, samples measured phase signal 1350 and delivers secondary sampled phase 1351 to secondary subtractor 1326. Phase predictor 1330, clocked by secondary reference clock signal 1305, calculates secondary predicted phase 1352. Secondary subtractor 1326 calculates a secondary difference 1353 between secondary predicted phase 1352 and secondary sampled phase 1351, and forwards secondary difference 1353 to secondary loop filter 1332, which integrates and filters secondary difference 1353 to provide oscillator control code 1354 to control the frequency of controlled oscillator 1320. The secondary sampled phase 1351, secondary predicted phase 1352, and secondary difference 1353 may be limited to integer numbers, as discussed in reference to earlier PLLs in this patent document, or they may include rational numbers as illustrated here. Phase sampler 1311 may include time-to-digital converter 1322 to measure fractions of cycles of output clock signal 1302 in relation to active edges of secondary reference clock signal 1305. An embodiment may scale an output value of time-to-digital converter 1322 and add it to the output value of modulo-K counter 1324 to produce a rational value for secondary sampled phase 1351. The use of rational values for 1351-1353 may lead to exceptionally low jitter in output clock signal 1302, although at the expense of extra complexity (inclusion of time-to-digital converter 1322) and higher power consumption.

Modulo-K counter 1324, fractional phase predictor 1346, and phase predictor 1330 need to be able to track the phase of the output clock signal over a sufficiently large range. For modulo-K counter 1324 this range equals K: upon reaching a counted value of K−1, the counter continues counting at 0. Naturally, the range K needs to be large enough to count $R_N$ cycles of output clock signal 1302 during one cycle of primary reference clock signal 1301.n. To correct large phase errors, or to relock at the correct phase after lock has been temporarily lost, embodiments of the invention may use a large range K, for instance K>>$R_N$. For example, the range K of the modulo-K counter 1324 may be at least two times larger than a maximum number of output clock signal cycles $R_N$ during a reference clock signal cycle. Thus, the maximum value of a phase error is not limited by the period of primary reference clock signal 1301.n, but by the larger of K and a range of fractional phase predictor 1346. The range of fractional phase predictor 1346 has been clarified with reference to FIG. 2A. For phase predictor 1330, the same or similar concepts apply.

The monitor-and-adjust blocks (e.g. 1348 in block 1313) are active only for loops that are not selected by multiplexer 1334. Monitor-and-adjust blocks monitor the primary difference signals from the respective subtractors and adjust registers (not shown) inside fractional phase predictors to minimize the primary differences.

Any adjustment in the currently active loop can break the desired relationship between input and output frequency. The function of a monitor-and-adjust block is to maintain the minimum primary difference of a currently unused primary reference clock signal, and indicate if its frequency is at the desired ratio to the output clock signal.

The monitor-and-adjust blocks may also generate a signal (not shown) to indicate which primary reference clock signals have matching frequencies to the primary reference clock signal that jitter attenuator 1300 is currently locked to. A simpler embodiment of a monitor-and-adjust block just copies the primary sampled phase into a register (not shown) inside the fractional phase predictor so that the last prediction is effectively correct.

In embodiments of the invention, multiplexer 1334 can be replaced by an averaging block that creates an error signal replacing selected primary difference 1374 by averaging all the primary differences that are currently valid and whose monitor-and-adjust blocks have the primary difference associated with any valid primary reference clock signal 1301.1-1301.n close to zero. In this case, output clock signal 1302 is effectively locked to all valid inputs and altering the members of the valid set has an even smaller impact on phase.

An embodiment can be optimized to have less circuitry. For example, instead of individual monitor-and-adjust blocks, an embodiment may have a single monitor-and-adjust block that cycles through the fractional phase predictors of all active loops, adjusting only one at a time.

In some embodiments, a primary loop can have an individual sleep mode. This is illustrated in block 1313, where gate 1340 is configured to interrupt primary reference clock signal 1301.n. When primary loop sleep signal $\overline{\text{Sleep.n}}$ is asserted, gated reference clock signal 1371 is inactive, and fractional phase predictor 1346 cannot calculate updates for primary predicted phase 1373 and register 1342 cannot update primary sampled phase 1372. In further embodiments, primary loop sleep signal $\overline{\text{Sleep.n}}$ can also place monitor-and-adjust block 1348 in sleep mode, such that effectively all circuits in primary loop block 1313 are inactive. An embodiment whose primary loops are all in sleep mode may place loop filter 1328 in sleep mode, maintaining a constant output. When this occurs, the secondary loop enters a holdover mode, maintaining frequency lock to the secondary reference clock signal 1305, where the output clock signal 1302 frequency is determined by the last active primary loop.

An embodiment may further include sleep mode signal $\overline{\text{SleepOsc}}$, which can stop operation of controlled oscillator 1320. This type of sleep mode impacts all loops, and fully halts operation of jitter attenuator 1300.

FIG. 13 shows example jitter attenuator 1300 as an embodiment with up-counting modulo-K counter 1324 and an up-counting fractional phase predictors. Other embodiments may use down-counters and/or down-counting fractional phase predictors. Counting limits may be chosen different than 0 and K, for example K and 0, or 0 and −K, or any other set of integer values that differ by K. Some embodiments may use an adder instead of a subtractor, and calculate a sampled phase as a negative value. FIG. 13 shows example jitter attenuator 1300 as an embodiment with AND gates for gates 1340, and with the signals $\overline{\text{Sleep1}}$ and $\overline{\text{SleepOsc}}$ asserted negative. A person having ordinary skill in the art will know that gating of primary reference clock signals 1301.1-1301.n can just as easily be achieved with another type of gate, such as a NAND gate, an OR gate, a NOR gate, an XOR gate, a pass gate, and a combination of any number of those gates, and with either one or both of the sleep signals asserted positive. Such embodiments are fully within the scope and ambit of the invention.

Figure 14:
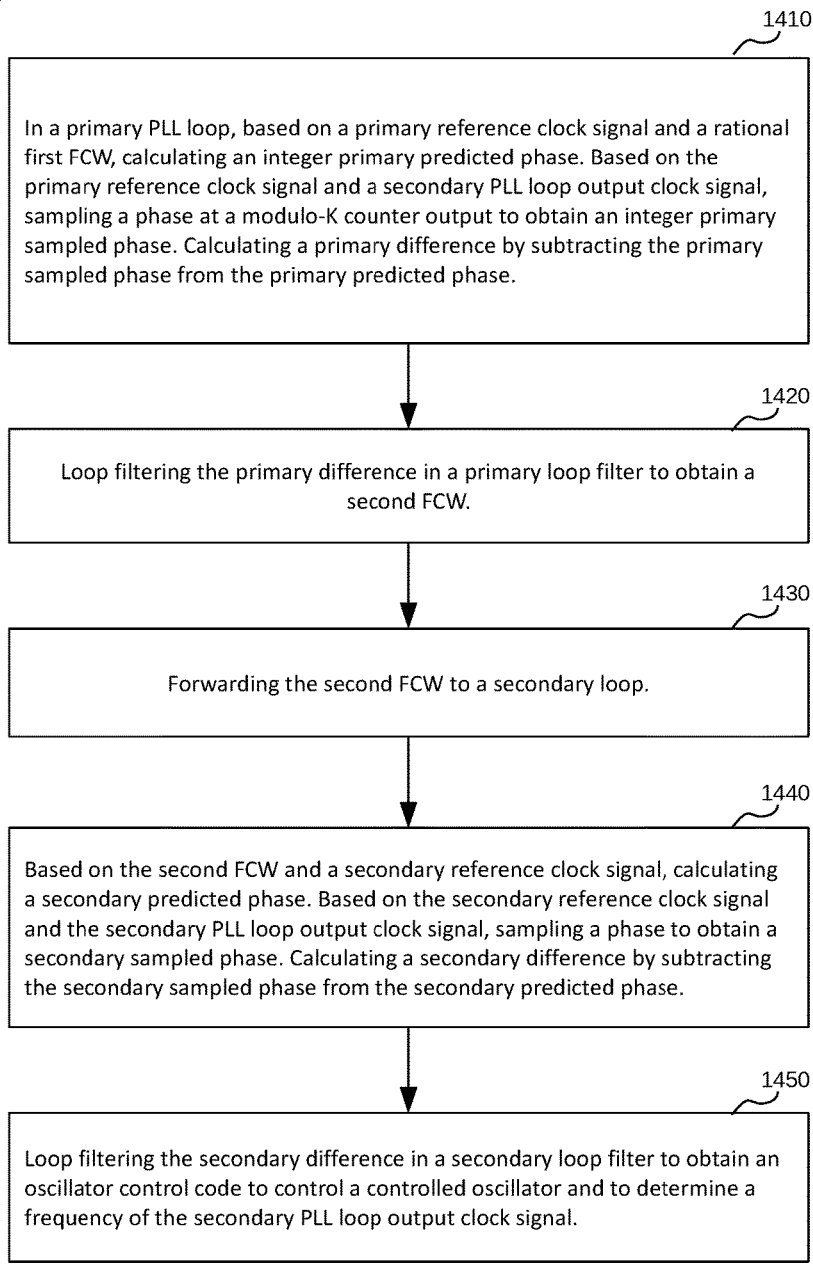
FIG. 14 illustrates a method for jitter attenuation according to an embodiment of the invention.

FIG. 14 illustrates a method 1400 for jitter attenuation according to an embodiment of the invention. Method 1400 comprises the following steps.

Step 1410—in a primary PLL loop, based on a primary reference clock signal and a rational first FCW, calculating an integer primary predicted phase. Based on the primary reference clock signal and a secondary PLL loop output clock signal, sampling a phase at a counter output to obtain an integer primary sampled phase. The counter may be a modulo-K counter. Calculating a primary difference by subtracting the primary sampled phase from the primary predicted phase.

Step 1420—loop filtering the primary difference in a primary loop filter to obtain a second FCW.

Step 1430—forwarding the second FCW to a secondary loop.

Step 1440—based on the second FCW and a secondary reference clock signal, calculating a secondary predicted phase. Based on the secondary reference clock signal and the secondary PLL loop output clock signal, sampling a phase to obtain a secondary sampled phase. Calculating a secondary difference by subtracting the secondary sampled phase from the secondary predicted phase.

Step 1450—loop filtering the secondary difference in a secondary loop filter to obtain an oscillator control code to control a controlled oscillator and to determine a frequency of the secondary PLL loop output clock signal.

Figure 15:
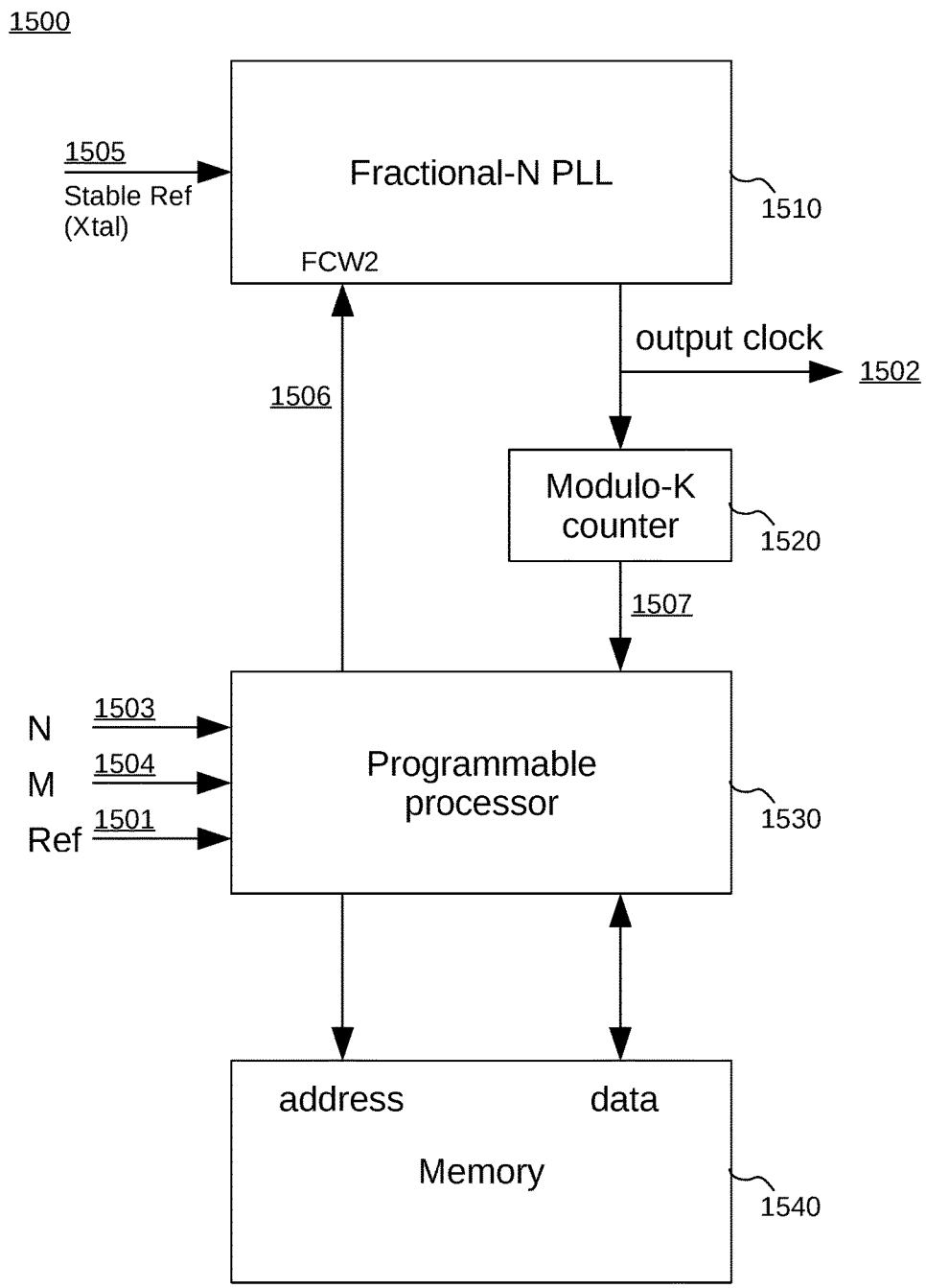
FIG. 15 illustrates a programmable system capable of implementing jitter attenuation methods according to embodiments of the invention.

FIG. 15 illustrates a programmable system 1500 capable of implementing jitter attenuation methods according to embodiments of the invention. System 1500 is a jitter attenuator that comprises a fractional-N PLL 1510, a modulo-K counter 1520, a programmable processor 1530, and a memory 1540. Memory 1540 may be tangible, and it may be non-transitory. Programmable processor 1530 is configured to store software instructions and/or data in memory 1540. Fractional-N PLL 1510 receives stable reference clock signal 1505 (for example, from a crystal oscillator). Programmable processor 1530 receives reference clock signal 1501, and a primary FCW comprising integer part N 1503 and fractional part M 1504. Programmable processor 1530 outputs secondary FCW 1506 to fractional-N PLL 1510. Fractional-N PLL 1510, whose frequency is controlled by secondary FCW 1506, outputs the output clock 1502. Modulo-K counter 1520 counts cycles of output clock 1502, and its output signal 1507 is a measure for the output clock phase, which it feeds back to programmable processor 1530. Some embodiments may store integer part N 1503 and fractional part M 1504 as parameters in memory 1540, either as part of the software instructions or as part of the data. Further embodiments may receive multiple reference clock signals, and may work with multiple FCWs. Yet further embodiments may use separate tangible non-transitory memories for software instructions and data.

Programmable processor 1530 is programmed to execute instructions for, for example, the following operations:

(a) in programmable processor 1530, based on the primary reference clock signal and a rational primary FCW, calculating an integer primary predicted phase; based on the primary reference clock signal and the fractional-N PLL 1510 output clock signal 1502, sampling a phase at the modulo-K counter 1520 output to obtain an integer primary sampled phase; calculating a primary difference by subtracting the primary sampled phase from the primary predicted phase;

(b) loop filtering the primary difference in a primary loop filter to obtain the secondary FCW; and (c) forwarding the secondary FCW to fractional-N PLL 1510 to control fractional-N PLL 1510 and to determine a frequency of the fractional-N PLL 1510 output clock signal 1502.

Figure 16:
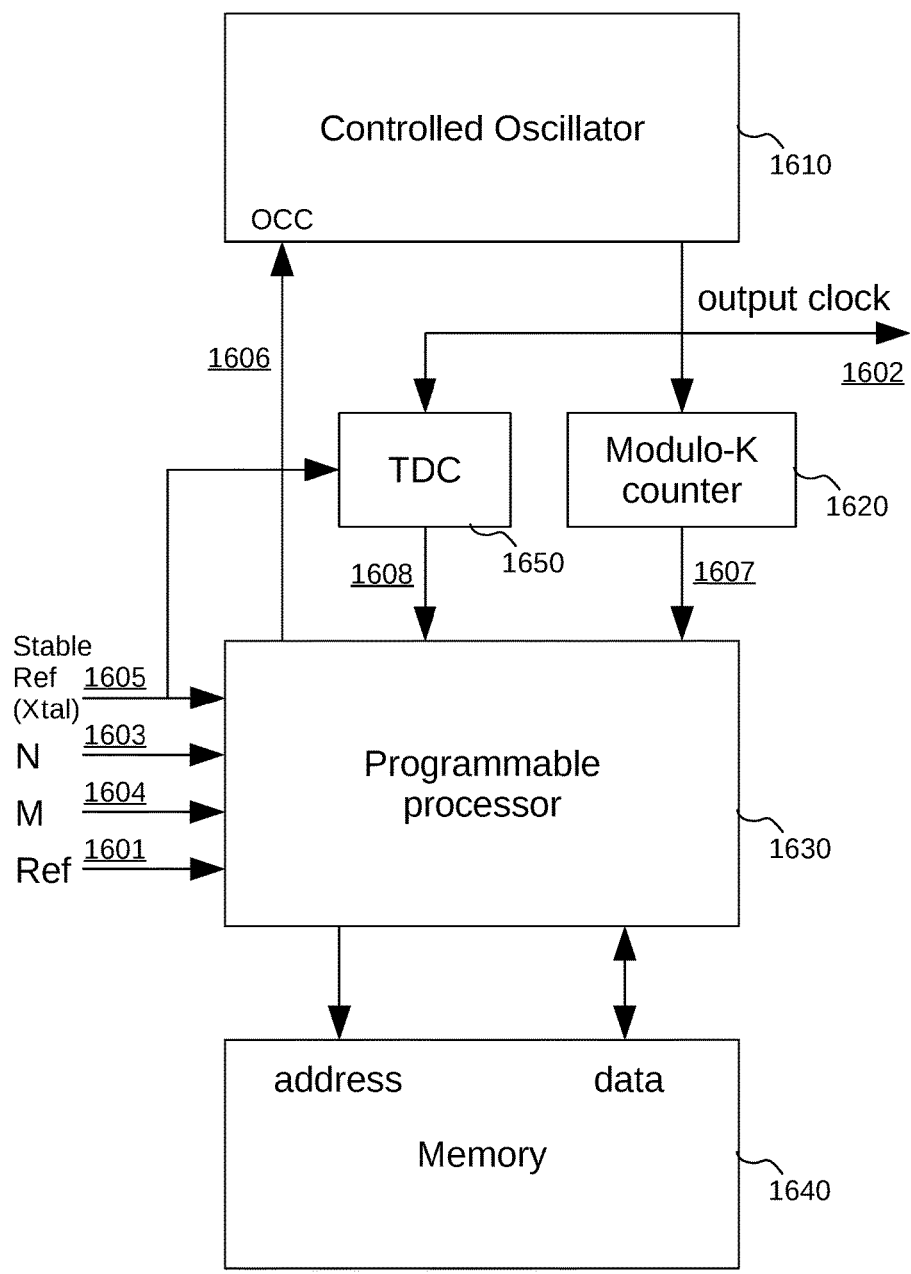
FIG. 16 illustrates another programmable system capable of implementing jitter attenuation methods according to embodiments of the invention.

FIG. 16 illustrates another programmable system, 1600, capable of implementing jitter attenuation methods according to embodiments of the invention. System 1600 is a jitter attenuator that comprises a controlled oscillator 1610, a modulo-K counter 1620, a programmable processor 1630, a memory 1640, and optionally a time-to-digital converter 1650. Memory 1640 may be tangible, and it may be non-transitory. Programmable processor 1630 is configured to store software instructions and/or data in memory 1640. Controlled oscillator 1610 receives oscillator control code 1606 from programmable processor 1630. Programmable processor 1630 receives reference clock signal 1601, a primary FCW comprising integer part N 1603 and fractional part M 1604, and stable reference clock signal 1605, which may, for example, come from a crystal oscillator. Controlled oscillator 1610, whose frequency is controlled by oscillator control code 1606, outputs the output clock 1602. Modulo-K counter 1620 counts cycles of output clock 1602, and its output signal 1607 is a measure for the output clock phase, which it feeds back to programmable processor 1630. Embodiments that include time-to-digital converter 1650 measure fractions of cycles of output clock signal 1602 in relation to active edges of stable reference clock signal 1605. An embodiment may scale an output value of time-to-digital converter 1650 and add it to the output value of modulo-K counter 1620 to produce a rational value for a secondary sampled phase, comprising integer part 1607 and fractional part 1608.

Some embodiments may store integer part N 1603 and fractional part M 1604 as parameters in memory 1640, either as part of the software instructions or as part of the data. Further embodiments may receive multiple reference clock signals, and may work with multiple FCWs. Yet further embodiments may use separate tangible non-transitory memories for software instructions and data.

Programmable processor 1630 is programmed to execute instructions for, for example, the following operations:

(a) based on a primary reference clock signal 1601 and a rational first FCW (1603, 1604), calculating an integer primary predicted phase. Based on the primary reference clock signal 1601 and controlled oscillator 1610 output clock signal 1602, sampling a phase at the modulo-K counter 1620 output to obtain an integer primary sampled phase. Calculating a primary difference by subtracting the primary sampled phase from the primary predicted phase.

(b) filtering the primary difference in a primary loop filter to obtain a second FCW.

(c) based on the second FCW and stable reference clock signal 1605, calculating a secondary predicted phase. Based on the secondary reference clock signal and the secondary PLL loop output clock signal, sampling a phase to obtain a secondary sampled phase. Calculating a secondary difference by subtracting the secondary sampled phase from the secondary predicted phase.

(d) filtering the secondary difference in a secondary loop filter to obtain an oscillator control code 1606 to control controlled oscillator 1610 and to determine a frequency of the output clock signal 1602.

It will be understood that the invention disclosed and defined in this specification extends to all alternative combinations of two or more of the individual features mentioned or evident from the text or drawings. All of these different combinations constitute various alternative aspects of the invention.

Although the description has been described with respect to particular embodiments thereof, these particular embodiments are merely illustrative, and not restrictive. For instance, many of the operations can be implemented on a printed card board PCB using off-the-shelf devices, in a System-on-Chip (SoC), application-specific integrated circuit (ASIC), programmable processor, or in a programmable logic device such as a field-programmable gate array (FPGA), obviating a need for at least part of the dedicated hardware. All such variations and modifications are to be considered within the ambit of the present invention the nature of which is to be determined from the foregoing description.

Any suitable technology for manufacturing electronic devices can be used to implement the circuits of particular embodiments, including bipolar, JFET, MOS, NMOS, PMOS, CMOS, BiCMOS, HBT, MESFET, FinFET, etc. Different semiconductor materials can be employed, such as silicon, germanium, SiGe, GaAs, InP, graphene, etc. Circuits may have single-ended or differential inputs, and single-ended or differential outputs. Terminals to circuits may function as inputs, outputs, both, or be in a high-impedance state, or they may function to receive supply power, a ground reference, a reference voltage, a reference current, or other. Although the physical processing of signals may be presented in a specific order, this order may be changed in different particular embodiments. In some particular embodiments, multiple elements, devices, or circuits shown as sequential in this specification can be operating in parallel.

Particular embodiments or parts of an embodiment may be implemented in a tangible, non-transitory computer-readable storage medium for use by or in connection with an instruction execution system, apparatus, system, or device. Particular embodiments can be implemented in the form of control logic in software, firmware, hardware or a combination of those. The control logic, when executed by one or more processors, may be operable to perform that which is described in particular embodiments. For example, a tangible medium such as a hardware storage device can be used to store the control logic, which can include executable instructions.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corre-

The invention claimed is:

1. A fractional-N phase-locked loop (PLL) configured for receiving a reference clock signal, the PLL comprising:
   a controlled oscillator configured to produce an output clock signal at an oscillator output;
   a modulo-K counter with an input coupled with the oscillator output;
   a register with a first input coupled with the modulo-K counter and a second input configured for receiving the reference clock signal;
   a fractional phase predictor with a first input configured for receiving the reference clock signal, wherein the fractional phase predictor is configured to calculate a predicted phase upon receiving a reference clock signal pulse, and wherein the predicted phase includes an integer number and is based on a rational number frequency control word (FCW); and
   one of a subtractor and an adder, configured for calculating an integer number difference between the predicted phase and an integer number stored in the register.

2. The PLL of claim 1, wherein the register includes a set of D-latches with enable inputs, wherein data inputs are coupled with the first register input, and the enable inputs are coupled with the second register input.

3. The PLL of claim 1, wherein a range K of the modulo-K counter is at least two times larger than a maximum number of output clock signal cycles during a reference clock signal cycle.

4. The PLL of claim 1, wherein the fractional phase predictor has a range that is at least two times larger than a maximum number of output clock signal cycles during a reference clock signal cycle.

5. The PLL of claim 1, wherein the fractional phase predictor includes an interpolator for determining an integer number part of the predicted phase based on a fractional part of the FCW.

6. The PLL of claim 5, wherein the interpolator performs a noise-shaping function to move at least a part of quantization noise energy from low frequencies to higher frequencies.

7. The PLL of claim 6, wherein the interpolator includes one of a sigma delta modulator, a bandpass sigma delta modulator, parallel sigma delta modulators, a multistage noise shaping (MASH) modulator, and a sturdy MASH (SMASH) modulator.

8. A method for generating an output clock signal whose phase is locked to a reference clock signal phase by a rational number, the method comprising:
   in a controlled oscillator, generating an output clock signal, wherein an output clock frequency is controlled by an oscillator control code;
   in a modulo-K counter, counting a number of output clock cycles;
   upon receiving a reference clock signal pulse, sampling the counted number of output clock cycles and storing the sampled number of counted output clock cycles in a register;
   upon receiving the reference clock signal pulse, calculating an integer number of predicted output clock cycles based on an integer number representing a reference clock signal phase and a rational number representing a frequency control word (FCW);
   calculating a difference between the integer number of predicted output clock cycles and the sampled number of counted output clock cycles, and forwarding the difference to a digital loop filter;
   in the digital loop filter, filtering the calculated difference to generate an updated oscillator control code, and in the controlled oscillator, updating the output clock frequency; and
   upon receiving successive reference clock signal pulses, updating the sampled number of counted output clock cycles and the number of predicted output clock cycles to provide the controlled oscillator updated oscillator control codes to lock the output clock signal phase to the reference clock signal phase by a rational number.

9. The method of claim 8, wherein calculating the integer number of predicted output clock cycles comprises determining an integer number part of the predicted output clock cycles based on a fractional part of the FCW.

10. The method of claim 9, further including noise-shaping to move at least a part of a quantization noise energy from low frequencies to higher frequencies.

11. The method of claim 10, wherein noise-shaping is based on one of sigma delta modulation, bandpass sigma delta modulation, parallel sigma delta modulation, multi-stage noise shaping (MASH) modulation, and sturdy MASH (SMASH) modulation.

12. A programmable PLL, comprising:
   a controlled oscillator configured to produce an output clock signal at an oscillator output;
   a modulo-K counter with an input coupled with the oscillator output;
   a programmable processor with a first input coupled with a modulo-K counter output, a second input configured for receiving a reference clock signal, and an output coupled with a controlled oscillator input to provide an oscillator control code;
   a tangible non-transitory memory coupled with the programmable processor and configured to store at least one of program instructions or data;
   wherein the programmable processor is programmed to execute instructions for the following operations:
      (a) upon receiving a reference clock signal pulse, sampling a modulo-K counter output value and storing the output value as a sampled phase in a register;
      (b) upon receiving the reference clock signal pulse, calculating an integer number of predicted output clock cycles based on an integer number representing a reference clock signal phase and a rational number representing a frequency control word (FCW);
      (c) calculating a difference between the integer number of predicted output clock cycles and the sampled phase;
      (d) loop filtering the calculated difference to generate an updated oscillator control code; and
      (e) upon receiving successive reference clock signal pulses, updating the sampled phase and the number of predicted output clock cycles to provide the controlled oscillator updated oscillator control codes to lock the output clock signal phase to the reference clock signal phase.

13. The programmable PLL of claim 12, wherein a range K of the modulo-K counter is at least two times larger than a maximum number of output clock signal cycles during a reference clock signal cycle.

14. The programmable PLL of claim 12, wherein calculating the integer number of predicted output clock cycles includes noise-shaping to move at least a part of quantization noise energy from low frequencies to higher frequencies.

15. The programmable PLL of claim 14, wherein noise-shaping is based on one of sigma delta modulation, bandpass sigma delta modulation, parallel sigma delta modulation, multistage noise shaping (MASH) modulation, and sturdy MASH (SMASH) modulation.

16. A tangible non-transitory processor-readable memory, carrying software instructions executable by a programmable processor, including one or more processor-executable instructions for the following operations:
   (a) upon receiving a reference clock signal pulse, sampling a modulo-K counter output value and storing the output value as a sampled phase in a register;
   (b) upon receiving the reference clock signal pulse, calculating an integer number of predicted output clock cycles based on an integer number representing a reference clock signal phase and a rational number representing a frequency control word (FCW);
   (c) calculating a difference between the integer number of predicted output clock cycles and the sampled phase;
   (d) loop filtering the calculated difference to generate an updated oscillator control code; and
   (e) upon receiving successive reference clock signal pulses, updating the sampled phase and the number of predicted output clock cycles to provide a controlled oscillator updated oscillator control codes to lock an output clock signal phase to the reference clock signal phase.

17. The tangible non-transitory memory of claim 16, wherein calculating the integer number of predicted output clock cycles includes noise-shaping to move at least a part of quantization noise energy from low frequencies to higher frequencies.

18. The tangible non-transitory memory of claim 17, wherein noise-shaping is based on one of sigma delta modulation, bandpass sigma delta modulation, parallel sigma delta modulation, multistage noise shaping (MASH) modulation, and sturdy MASH (SMASH) modulation.

* * * * *